United States Patent [19]
Kashimura

[11] Patent Number: 6,141,250
[45] Date of Patent: Oct. 31, 2000

[54] NON-VOLATILE SEMICONDUCTOR MEMORY DEVICE

[75] Inventor: Masahiko Kashimura, Tokyo, Japan

[73] Assignee: NEC Corporation, Tokyo, Japan

[21] Appl. No.: 09/409,432

[22] Filed: Sep. 30, 1999

[30] Foreign Application Priority Data

Sep. 30, 1998 [JP] Japan .................................. 10-294676

[51] Int. Cl.[7] .................................................. G11C 16/04
[52] U.S. Cl. .............................. 365/185.11; 365/185.12; 365/185.26
[58] Field of Search .......................... 365/185.11, 185.12, 365/185.05, 185.26, 185.33, 185.1

[56] References Cited

U.S. PATENT DOCUMENTS 5,646,060  7/1997  Chang et al. .............................. 437/43
5,923,587  7/1999  Choi .................................... 365/185.11

FOREIGN PATENT DOCUMENTS 64-81272  3/1989  Japan .

OTHER PUBLICATIONS

S. Mukherjee et al., "A Single Transistor EEPROM Cell and its Implementation in a 512K CMOS EEPROM", *International Electronic Device Conference Technical Digest*, 1985 IEEE, pp. 616–619.

*Primary Examiner*—David Nelms
*Assistant Examiner*—David Lam
*Attorney, Agent, or Firm*—Young & Thompson

[57] ABSTRACT

A non-volatile semiconductor memory device being able to read, write and erase data at a much higher speed. The non-volatile semiconductor memory device used as a flash memory is composed of a memory cell array, a row address buffer, a row decoder, a row driver, a column address buffer, a column decoder, a column selector, a sense amplifier circuit, a writing circuit and a control circuit, wherein selection and non-selection of memory cells at the time of reading is performed not by a control gate of a memory transistor but by control on normal voltage of a switch transistor.

33 Claims, 27 Drawing Sheets

| voltage at each terminal | | | | | |
|---|---|---|---|---|---|
| | Vs | Vsg | Vcg | Vd | Vsub |
| writing(selected) | 0 | 0 | 16v | 0/6v | 0 |
| (non-selected) | 0 | 0 | 8v | 6v | 0 |
| erasing | 0 | $V_{DD}$ | -16v | 0 | 0 | for Vd in writing, 0v or 6v is selected
depending on writing data

Vs;source voltage

Vsg;switching gate voltage

Vcg;control gate voltage

Vd;drain voltage

Vsub;substrate voltage

FIG.11

| voltage at each terminal | | | | | |
|---|---|---|---|---|---|
| | Vs | Vsg | Vcg | Vd | Vsub |
| writing(selected) | -8v | -8v | 8v | -2/-8v | -8v |
| (non-selected) | -8v | -8v | 0v | -2 | -8v |
| erasing | X | 8v | -8v | X | 8v |

X;floating for Vd in writing,-2v or -8v is selected depending on writing data

FIG.17

| | voltage of each terminal | | | | | |
|---|---|---|---|---|---|---|
| | Vs | Vsg | Vcg | Vd | Vdg | Vsub |
| writing(selected) | 0 | 0 | 16v | 0/6v | 10V | 0 |
| (non-selected) | 0 | 0 | 0v | 6v | 0 | 0 |
| erasing(selected) | 0 | $V_{DD}$ | -16v | 0 | $V_{DD}$ | 0 |
| (non-selected) | 0 | 0 | 0 | 0 | 0 | 0 | for Vd in writing, 0v or 6v is selected depending on writing data

*writing of data*

*erasing of data* writing of data erasing of data writing of data erasing of data writing of data erasing of data

NON-VOLATILE SEMICONDUCTOR MEMORY DEVICE

BACKGROUND OF THE INVENTION

1. Field of the Invention

The present invention relates to a non-volatile semiconductor memory device and more particularly to an electrically erasable programmable read-only memory (EEPROM).

2. Description of the Related Art

In such a memory cell constituting an EEPROM shown in FIGS. 22A and 22B, one-device type MOS memory having a control gate 1 and a floating gate 5 is electrically insulated by a gate oxide film 3 and an insulating oxide film 4, and is disposed between the control gate 1 and a semiconductor substrate 2 immediately below the control gate. Though an advantage of the one-device type memory is that its cell size can be made small, various kinds of the memory devices provided with improved methods for injection of electrons into the floating gate or for attraction of electrons from the same have been developed as described below.

According to a first method, as depicted in FIG. 22A, writing of data to a selected memory is achieved by applying a high bias voltage to a drain conjunction to generate a CHE (Channel Hot Electron) at an end portion of a drain region 6 and by injecting the CHE into the floating gate through the thin gate oxide film 3. Erasing of data, as shown in FIG. 22B, is achieved by attracting electrons accumulated in the floating gate 5 to a source region 7 by FN (Fowler Nordheim) tunnel currents (as disclosed in, for example, Japanese Laid-open Patent Application No. Sho64-81272, and as published in International Electronic Device Conference Technical Digest, PP.616 to PP.619).

According to a second method, the method for writing data to a selected memory cell is, as shown in FIG. 23A, the same for the first method in that it is achieved by injecting the CHE generated at the end portion of the drain region into the floating gate 5 through a thin gate oxide film 3. However, erasing of data, as shown in FIG. 23B, is achieved by attracting electrons accumulated in the floating gate to a semiconductor substrate 2 disposed immediately below the floating gate through the gate oxide film 3 by FN tunnel currents.

Moreover, according to a third method, writing of data to a selected memory cell is, as shown in FIG. 24A, achieved by attracting electrons accumulated in a floating gate 5 to a drain region 6 or a source region 7 by FN tunnel currents. However, erasing of data, as shown in FIG. 24B, is achieved by injecting electrons from a semiconductor substrate 2 to the floating gate through a gate oxide film 3 by FN tunnel currents.

On the other hand, as shown in FIGS. 25A and 25B, a two-device type memory cell, which is intended to improve writing and erasing characteristics of each memory cell, is known as wherein, a MOS transistor for switching (a switch transistor 10 in the drawing) is connected serially to a source of a floating-gate type MOS transistor (memory transistor 8) (for example, in U.S. Pat. No. 5,646,060).

In the two-device type memory cells, as shown in FIG. 25A, writing of data to a selected memory cell is achieved, with a switch transistor 10 turned off, by applying a voltage of 8 V to a control gate 11 of a memory transistor 8 and 6 V (being lower than a control gate voltage) to a drain terminal and by injecting a CHE from a drain region 12 to a floating gate 13 (see FIG. 25A), while, erasing of data is achieved by applying a voltage of −10 V to the floating gate 13 and 5 V to the drain terminal, thereby attracting electrons from the floating gate 13 to the drain region 12 by FN tunnel currents (see FIG. 22B). Furthermore, to read data from a selected memory cell, with a switch transistor 10 turned on, a voltage of 0 V is applied to a source terminal, a power supply voltage VCC to a control gate terminal and 1 V to a drain terminal respectively, and whether the read data is a "0" or a "1" is judged depending on the flow or non-flow of currents through the memory cell. At this point, a voltage of 0 V is applied to a control gate terminal of an non-selected memory cell.

However, the conventional semiconductor memory device described above has a shortcoming in that its reading speed is low because the control gates 1 and 11 are used to control a voltage in writing, erasing and reading operations. That is, in writing or erasing operations, to inject electrons from the control gates 1 and 11 by FN tunnel currents or to attract electrons by FN tunnel currents, the control gates require high voltages and therefore, as shown in FIGS. 26 and 27, a high voltage control circuit is connected to the control gates 1 and 11. However, to read data, the high voltage is not required and therefore a row decoder is composed of a normal voltage circuit 15. Because these two outputs from the high voltage control circuit and from the normal voltage circuit are used to control a voltage of the same control gates 1 and 11, these two circuits are conventionally connected to the control gates 1 and 11. However, to protect the normal voltage circuit 15 having less withstand capability, a voltage relaxation circuit 16 is interposed between the normal voltage circuit 15 and the high voltage control circuit 14. The insertion of the voltage relaxation circuit and great parasitic capacity of the high voltage control circuit 14 interfere with high-speed operations.

In addition, because the voltage relaxation circuits with the same numbers as those of word lines are required, the number and area of devices to be used for, in particular, two-device type memory cells increase accordingly.

There is a method to control the control gate voltage Vcg by using only the high voltage generating circuit in the operations of read data, however, such high voltage generating circuits are usually composed of a high voltage withstand transistor which uses thick gate oxide films and has increased gate length to raise its withstand capabilities. Accordingly, to obtain a predetermined on-current, it is necessary to increase a gate width, resulting in an increase of parasitic capacity. However, because of this, the operational speed of the high voltage circuit is remarkably low compared with that of the normal voltage circuit, thus interfering with high-speed reading.

Moreover, in the conventional semiconductor memory devices described above, an operational principle is employed that, at the time of read data, a voltage of the control gate is changed depending on selection or non-selection. However, whenever the voltage is changed, voltage stress is generated, causing the deterioration of data holding characteristics of the floating gate. As shown in Table 1, the conventional floating gate, when a "0" is written, is at a potential of, for example, −1 V and when a "1" is written, is at a potential of, for example, +1 V. If reading of data is to be achieved by applying, for example, 5 V to the control gate of a selected memory cell, the potential state of the floating gate is changed from −1 V to, for example, 0 V, or from +1 V to, for example, +2 V. This means that the potential of the floating gate varies in a great range between −1 V and +2 V, causing a large voltage stress.

TABLE 1

|  | Non-selected | | Selected | |
| --- | --- | --- | --- | --- |
|  | Writing of "0" | Writing of "1" | Writing of "0" | Writing of "1" |
| Control gate | 0 | 0 | 5 | 5 |
| Floating gate | −1 | +1 | 0 | 2 |

As described above and shown in FIG. 28, due to the fact that the control gate voltage Vcc is changed depending on selection and non-selection at the time of read data, there is a problem in that a threshold voltage Vt of an erasing cell is controlled so as to narrow the range of voltages.

Another problem is that, because a considerably large drain current must be passed to perform writing operations by injecting the CHE from the drain region to the control gate, power consumption is made large and a charge pump having a large device area is required.

A further problem is that, because a high electric field in the drain region (or source region) is generated when electrons are attracted from the floating gate to the drain by FN tunnel currents, the band is made narrow in the vicinity of the PN junction region and of an interface between the gate oxide film and the drain region (or the source region), causing a tunnel current between bands by holes or electrons to flow, holes to be injected to the gate oxide film or the floating gate, and over-erasing or over-writing to occur which leads to an improper reading.

Another problem is that, when the CHE is injected from the drain region to the control gate or when electrons are attracted from the floating gate to the drain region (or the source region) by FN tunnel currents, the injection or attraction at a one-sided portion of the floating gate takes place, causing local damage to the gate oxide film and a breakdown of a device.

SUMMARY OF THE INVENTION

In view of the above, it is an object of the present invention to provide a non-volatile semiconductor memory device which can read data at a much higher speed, prevent the deterioration of oxide films and reduce an excess number of devices used and is also excellent in data holding characteristics.

According to a first aspect of the present invention, there is provided a non-volatile semiconductor memory device being able to electrically rewrite data comprising:

two or more pairs of word lines;

two or more bit lines; and more than one non-volatile memory cell disposed at the point of intersection of the pairs of word lines and bit lines;

whereby each memory cell composed of at least two MIS-type devices containing a stacked gate-type memory transistor having a control gate and a floating gate for accumulation of carriers and a switch transistor having a switching gate;

each pair of word lines being composed of a pair of a first word line and a second word line;

each first word line being connected to the control gate of a group of memory cells disposed along the first word line or along a first branched word line branched from the first word line and each second word line being connected to the switching gate of a group of memory cells disposed along the second word line or along a second branched word line branched from the second word line;

each bit line being connected to a drain of a group of the memory cells disposed along the bit line; and the switching gate of the switch transistor being used to control selection or non-selection of selected memory cells on selecting bit lines at the time of read data; and the selecting bit lines is used to read data from selected memory cells.

In the foregoing, a preferable mode is one wherein data is read, at the time of read data, regardless of whether any memory cell is selected or not selected, with the control gates of all memory transistors maintained at the same potential via the first word lines, by controlling normal voltage with the switching gate of the switch transistor.

Also, a preferable mode is one wherein data is read, at the time of read data, regardless of whether any memory cell is selected or not selected, with the voltage of the control gates of all memory transistors maintained at 0 V or around it via the first word lines, by controlling the normal voltage with the switching gate of the switch transistor.

Also, a preferable mode is one wherein data is written, at the time of writing data, by connecting a high voltage control circuit to the control gate of the memory transistor through the first word line, while data is read, at the time of read data, by connecting a normal voltage circuit to the switching gate of the switch transistor through the second word line.

Also, a preferable mode is one wherein the switch transistor is connected serially to a source of the memory transistor.

Also, a preferable mode is one wherein data is erased by attracting carriers from the floating gate of the memory transistor and carriers are attracted from the floating gate of the memory transistor sufficiently enough to cause the erasing state to be of a depletion type.

Also, a preferable mode is one wherein the non-volatile semiconductor memory device is a flash memory.

Furthermore, a preferable mode is one wherein the memory cell is composed of, instead of the stacked-gate type memory transistor, a MIOS-type memory transistor, the gate insulating film of which consists of a first insulating film on a lower layer and a second insulating film on an upper layer in which carriers are accumulated in the trap surface in the second insulating film existing in the vicinity of an interface of these films.

According to a second aspect of the present invention, there is provided a non-volatile semiconductor memory device being able to electrically rewrite data, comprising:

two or more pairs of word lines and two or more bit lines formed on a semiconductor substrate; and more than one non-volatile memory cell disposed at the point of intersection of the pairs of word lines and bit lines;

whereby each memory cell composed of at least two MIS-type devices containing a stacked gate-type memory transistor having a control gate and a floating gate for accumulation of carriers and a switch transistor having a switching gate;

each pair of word lines being composed of a pair of a first word line and a second word line;

each first word line being connected to the control gate of a group of memory cells disposed along the first word line or along a first branched word line branched from the first word line and each second word line being connected to the switching gate of a group of memory cells disposed along the second word line or along a second branched word line branched from the second word line;

each bit line being connected to a drain of a group of the memory cells disposed along the bit line; and the selected memory cell wherein, at the time of writing and erasing data, a high voltage is applied between the control gate of the memory transistor and the semiconductor substrate and carriers are injected by tunnel currents from a semiconductor region immediately below the floating gate to the floating gate or carriers are attracted by tunnel currents from the bottom face of the floating gate to the semiconductor region immediately below the floating gate.

In the foregoing, it is preferable that each memory transistor is formed within a well, at the time of writing and erasing data, in the selected memory cell, a high voltage is applied between the control gate of the memory transistor and the well and carriers are injected by tunnel currents from a semiconductor region immediately below the floating gate to the floating gate or carriers are attracted by tunnel currents from the bottom face of the floating gate to the semiconductor region immediately below the floating gate.

Also, it is preferable that, at the time of erasing data, a source and a drain of the memory transistor is set to approximately the same potential as that of a semiconductor region disposed immediately below the floating gate or to a floating state.

Also, it is preferable that the memory transistor is composed of an n-channel transistor and to the control gate of the memory transistor selected through the first word line is applied a voltage being higher than a substrate potential and wherein to the bit line selected to write a "0" (or a "1") is applied a voltage being at the same level as for the substrate, while to the bit line selected to write a "1" (or a "0") and to a control gate of non-selected memory transistors is applied a voltage being higher than the substrate potential and lower than that of the control gate of the selected memory transistor so that data is written.

Also, it is preferable that, at the time of writing data, the control gate potential of the non-selected memory transistor is higher than that of the bit line selected to write a "1" (or a "0").

Also, it is preferable that, at the time of writing data, the switch transistor is turned OFF, and a source and a drain of the memory transistor in selected memory cells are set to approximately the same potential as that of a semiconductor region disposed immediately below the floating gate.

A preferable mode is one wherein the switch transistor is connected to a source of the memory transistor.

Also, a preferable mode is one wherein, at the time of writing data, data is written by connecting a high voltage control circuit to the control gate of the memory transistor through the first word line, while data is read by connecting a normal voltage circuit to the switching gate of the switch transistor through the second word line.

Also, a preferable mode is one wherein the switch transistor is connected serially to a source of the memory transistor.

Also, a preferable mode is one wherein carriers are attracted from the floating gate of the memory transistor to erase data and, at the time of erasing data, carriers are attracted from the floating gate of the memory transistor sufficiently enough to cause the erasing state to be of a depletion type.

Also, a preferable mode is one wherein the non-volatile semiconductor memory device is a flash memory.

Furthermore, a preferable mode is one wherein the memory cell is composed of, instead of the stacked-gate type memory transistor, a MIOS-type memory transistor, the gate insulating film of which consists of a first insulating film on a lower layer and a second insulating film on an upper layer in which carriers are accumulated in the trap surface in the second insulating film existing in the vicinity of an interface of these films.

According to a third aspect of the present invention, there is provided a non-volatile semiconductor memory device being able to electrically rewrite data, comprising:

two or more groups of word lines;

two or more bit lines; and more than one non-volatile memory cell disposed at the point of intersection of the groups of word lines and bit lines;

whereby each memory cell composed of three MIS-type devices containing a stacked gate-type memory transistor having a control gate and a floating gate for accumulation of carriers, a switch transistor having a switching gate connected serially to a source of the memory transistor and a selection transistor having a selecting gate connected serially to a drain of the memory transistor;

each group of word lines being composed of a group of a first word line, a second word line and a third word line;

each first word line being connected to the control gate of a group of memory cells disposed along the first word line or along a first branched word line branched from the first word line, each second word line being connected to the switching gate of a group of memory cells disposed along the second word line or along a second branched word line branched from the second word line and each third word line being connected to the selecting gate of a group of memory cells disposed along the third word line or along a third branched word line branched from the third word line;

each bit line being connected to a drain of a group of the memory cells disposed along the bit line; and the switching gate of the switch transistor and the selecting gate of the selection transistor being used, at the time of read data, to control selection or non-selection of selected memory cells on selecting bit lines to read data the selected memory through the selecting bit line.

In the foregoing, a preferable mode is one wherein data is read, at the time of read data, regardless of whether any memory cell is selected or not selected, with the control gates of all memory transistors maintained at the same potential through the first word lines, by controlling normal voltage with the switching gate of the switch transistor and the selecting gate of the selection transistor.

Also, a preferable mode is one wherein data is read, at the time of read data, regardless of whether any memory cell is selected or not selected, with the voltage of the control gates of all memory transistors maintained at 0 V or around it through the first word lines, by controlling the normal voltage with the switching gate of the switch transistor and the selecting gate of said selection transistor.

Also, a preferable mode is one wherein data is erased by attracting carriers from the floating gate of the memory transistor and carriers are attracted from the floating gate of the memory transistor sufficiently enough to cause the erasing state to be of a depletion type.

Also, a preferable mode is one wherein the memory cell is composed of, instead of the stacked-gate type memory transistor, a MIOS-type memory transistor, the gate insulating film of which consists of a first insulating film on a lower layer and a second insulating film on an upper layer in which carriers are accumulated in the trap surface in the second insulating film existing in the vicinity of an interface of these films.

Also, a preferable mode is one wherein, in the non-volatile semiconductor memory device, two or more memory cells are divided into n-pieces (n being a natural number of 2 or more) of blocks and data are able to be rewritten by block.

According to a fourth aspect of the present invention, there is provided a non-volatile semiconductor memory device being able to electrically rewrite data, comprising:

two or more groups of word lines and two or more bit lines formed on a semiconductor substrate; and more than one non-volatile memory cell disposed at the point of intersection of the groups of word lines and bit lines;

whereby each memory cell composed of three MIS-type devices containing a stacked gate-type memory transistor having a control gate and a floating gate for accumulation of carriers, a switch transistor having a switching gate connected serially to a source of the memory transistor and a selection transistor having a selecting gate connected serially to a drain of the memory transistor;

each group of word lines being composed of a group of a first word line, a second word line and a third word line;

each first word line being connected to the control gate of a group of memory cells disposed along the first word line or along a first branched word line branched from the first word line, each second word line being connected to the switching gate of a group of memory cells disposed along the second word line or along a second branched word line branched from the second word line and each third word line being connected to the selecting gate of a group of memory cells disposed along the third word line or along a third branched word line branched from said third word line;

each bit line being connected to a drain of a group of the memory cells disposed along the bit line; and the selected memory cell wherein, at the time of writing and erasing data, a high voltage is applied between the control gate of the memory transistor and the semiconductor substrate and carriers are injected by tunnel currents from a semiconductor region disposed immediately below the floating gate to the floating gate or carriers are attracted by tunnel currents from the bottom face of the floating gate to the semiconductor region immediately below said floating gate.

In the foregoing, it is preferable that, when each memory transistor is formed within a well, at the time of writing and erasing data, in the selected memory cell, a high voltage is applied between the control gate of the memory transistor and the well and carriers are injected by tunnel currents from a semiconductor region immediately below the floating gate to the floating gate or carriers are attracted by tunnel currents from the bottom face of the floating gate to the semiconductor region disposed immediately below the floating gate.

Also, it is preferable that, at the time of erasing data, a source and a drain of the memory transistor is set to approximately the same potential as that of a semiconductor region disposed immediately below the floating gate or to a floating state.

Also, it is preferable that, at the time of writing data, in selected memory cells, the selected transistor is turned ON and at the same time the switch transistor is turned OFF, while, in non-selected memory cells, both the selected transistor and the switch transistor are turned OFF.

Also, it is preferable that the memory transistor is composed of an n-channel transistor and to the control gate of the memory transistor selected through the first word line is applied a voltage being higher than a substrate potential and wherein to the bit line selected to write a "0" (or a "1") is applied a voltage being at the same level as for the substrate, while to the bit line selected to write a "1" (or a "0") is applied a voltage being higher than the substrate potential and lower than that of the control gate of the selected memory transistor so that data is written.

Also, it is preferable that carriers are attracted from the floating gate of the memory transistor to erase data and, at the time of erasing data, carriers are attracted from the floating gate of the memory transistor sufficiently enough to cause the erasing state to be of a depletion type.

Furthermore, it is preferable that the memory cell is composed of, instead of the stacked-gate type memory transistor, a MIOS-type memory transistor, the gate insulating film of which consists of a first insulating film on a lower layer and a second insulating film on an upper layer in which carriers are accumulated in the trap surface in the second insulating film existing in the vicinity of an interface of these films.

BRIEF DESCRIPTION OF THE DRAWING

The above and other objects, advantages and features of the present invention will be more apparent from the following description taken in conjunction with the accompanying drawings in which:

FIG. 11 is a chart showing potential states of each terminal of memory cells corresponding to each operation mode for writing and erasing in a non-volatile semiconductor memory device according to a second embodiment of the present invention;

FIG. 17 is a chart showing potential states of each terminal of memory cells corresponding to each operation mode for writing and erasing in the non-volatile semiconductor memory device;

DETAILED DESCRIPTION OF THE PREFERRED EMBODIMENTS

Best modes of carrying out the present invention will be described in further detail using various embodiments with reference to the accompanying drawings.

First Embodiment

Figure 1:
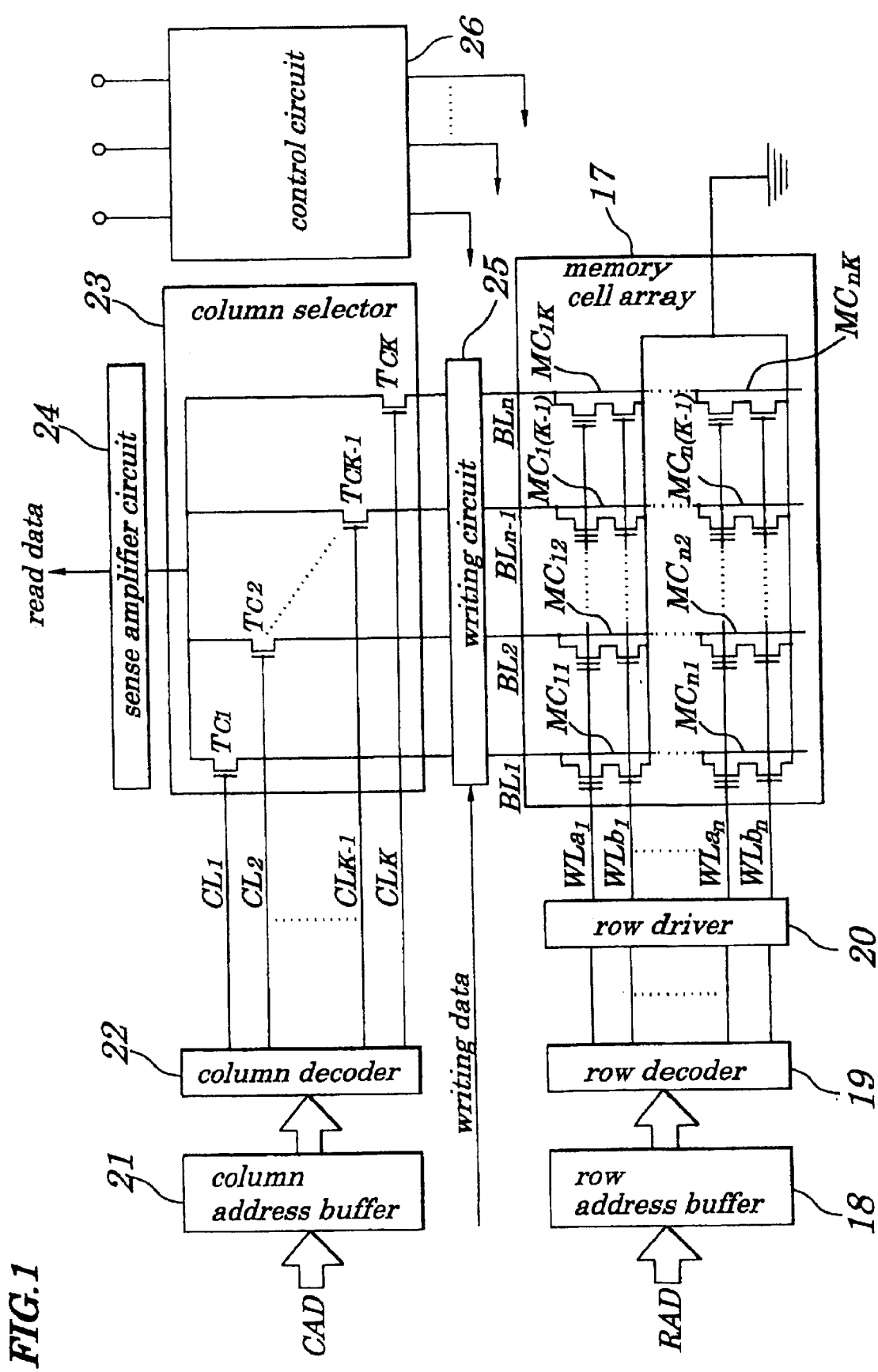
FIG. 1 is a block diagram showing electrical configurations of a non-volatile semiconductor memory device according to a first embodiment of the present invention.
Figure 2:
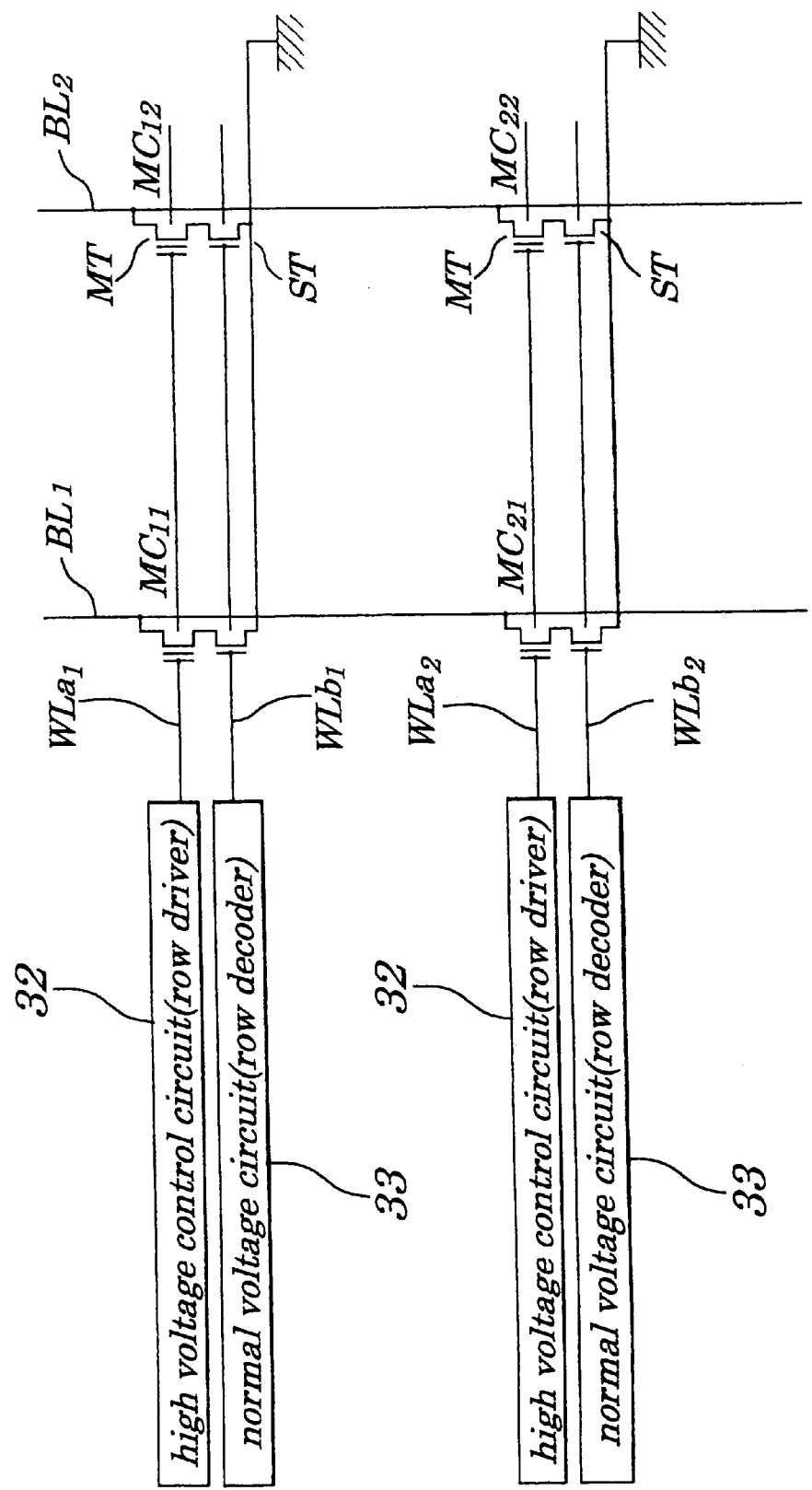
FIG. 2 is a wiring connection diagram of a high voltage control circuit and a normal voltage circuit as gate power supply circuits constituting the non-volatile semiconductor memory device.
Figures 3, 4:
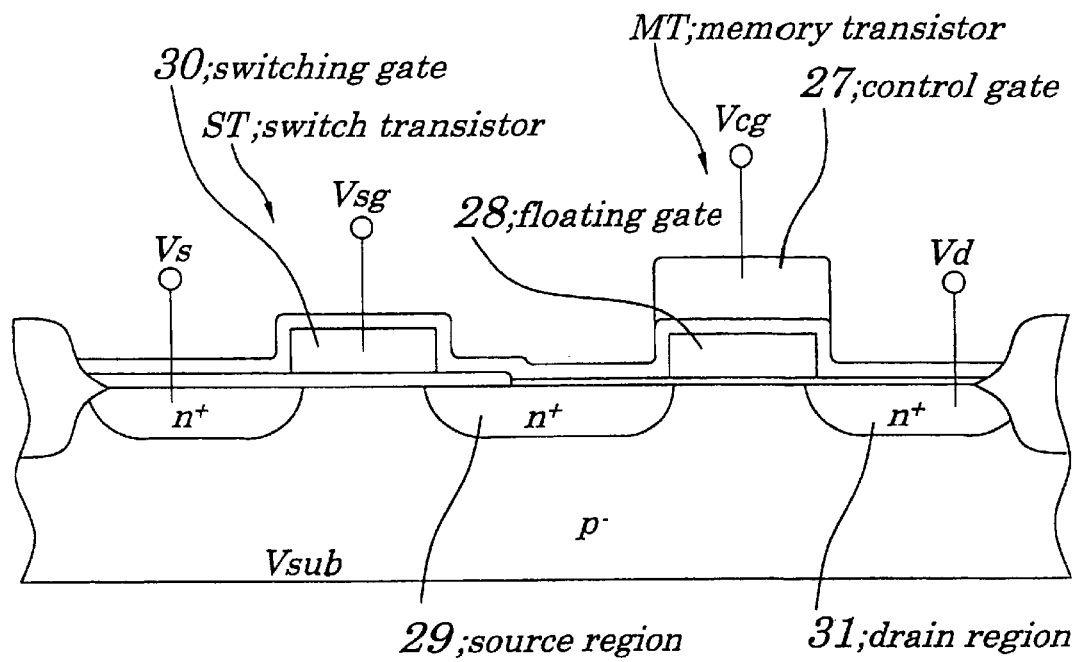
FIG. 3 is a cross-sectional view of a configuration of layers of a memory cell used for the non-volatile semiconductor memory device.
FIG. 4 is a chart showing a state of potentials of each terminal of the memory cell corresponding to each operational mode for writing and deleting in the non-volatile semiconductor memory device.
Figure 5:
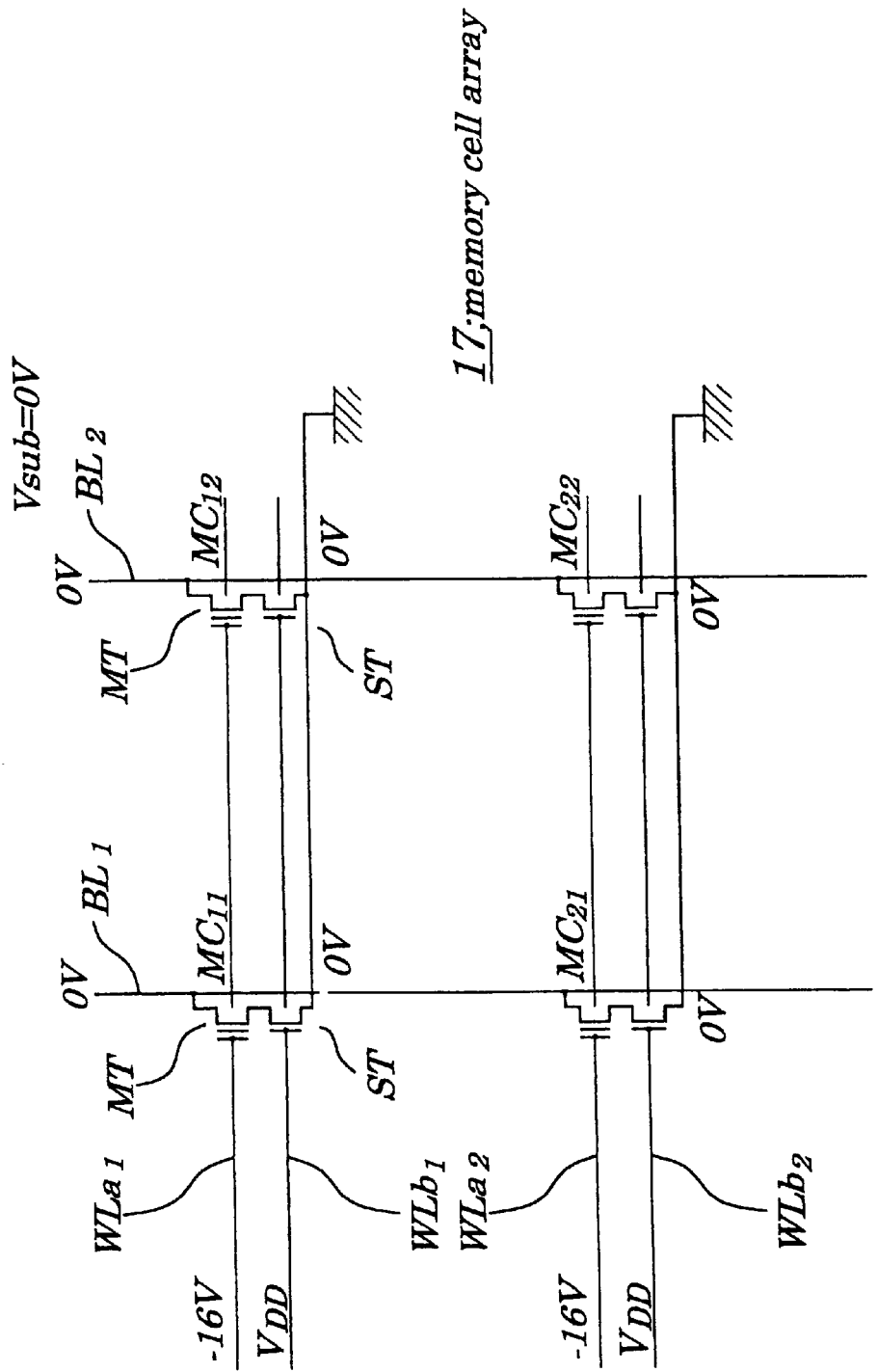
FIG. 5 is a wiring diagram showing a state of potentials at the time of erasing in the memory cell.
Figure 6:
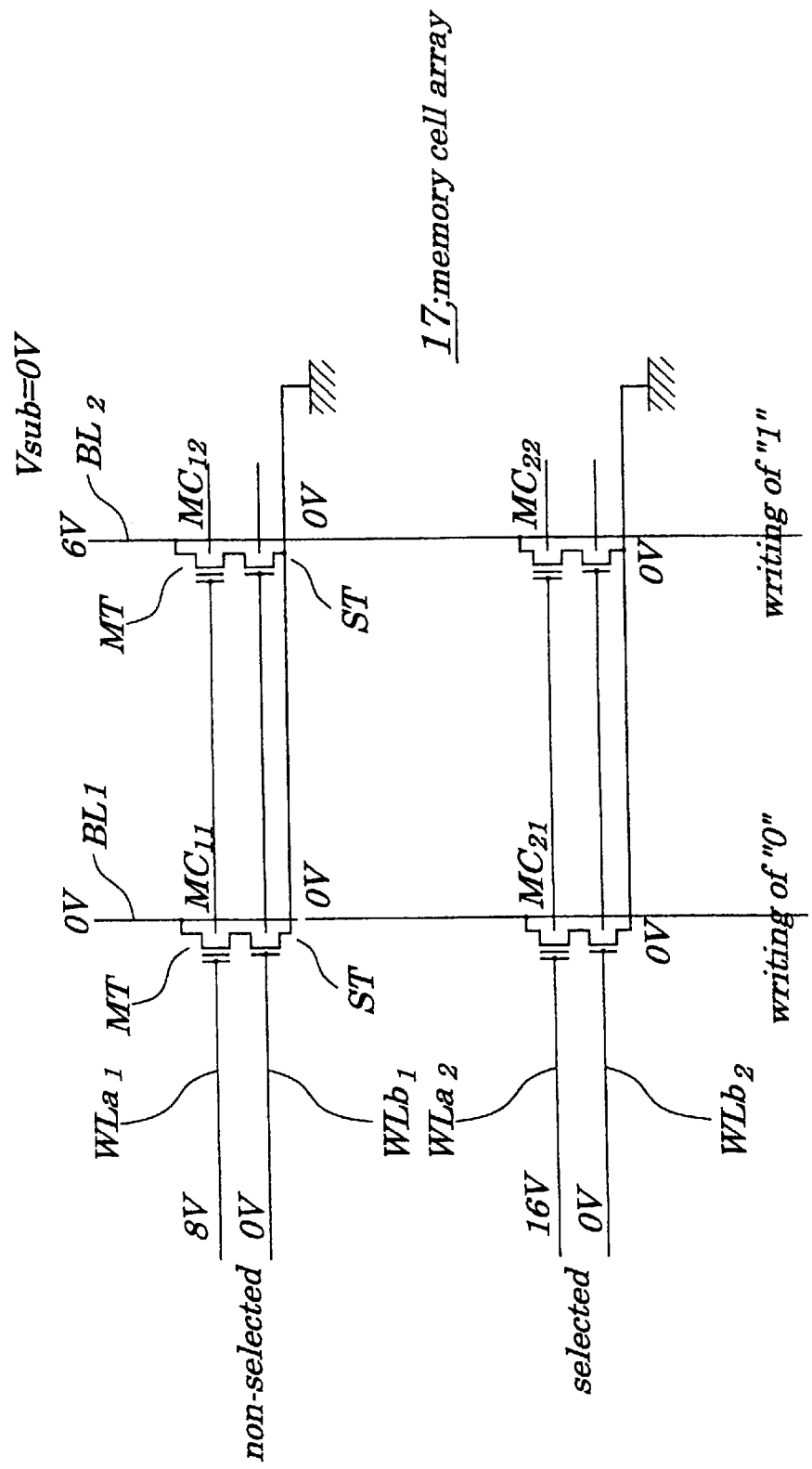
FIG. 6 is a wiring diagram showing a state of potentials at the time of writing in the memory cell.
Figure 7:
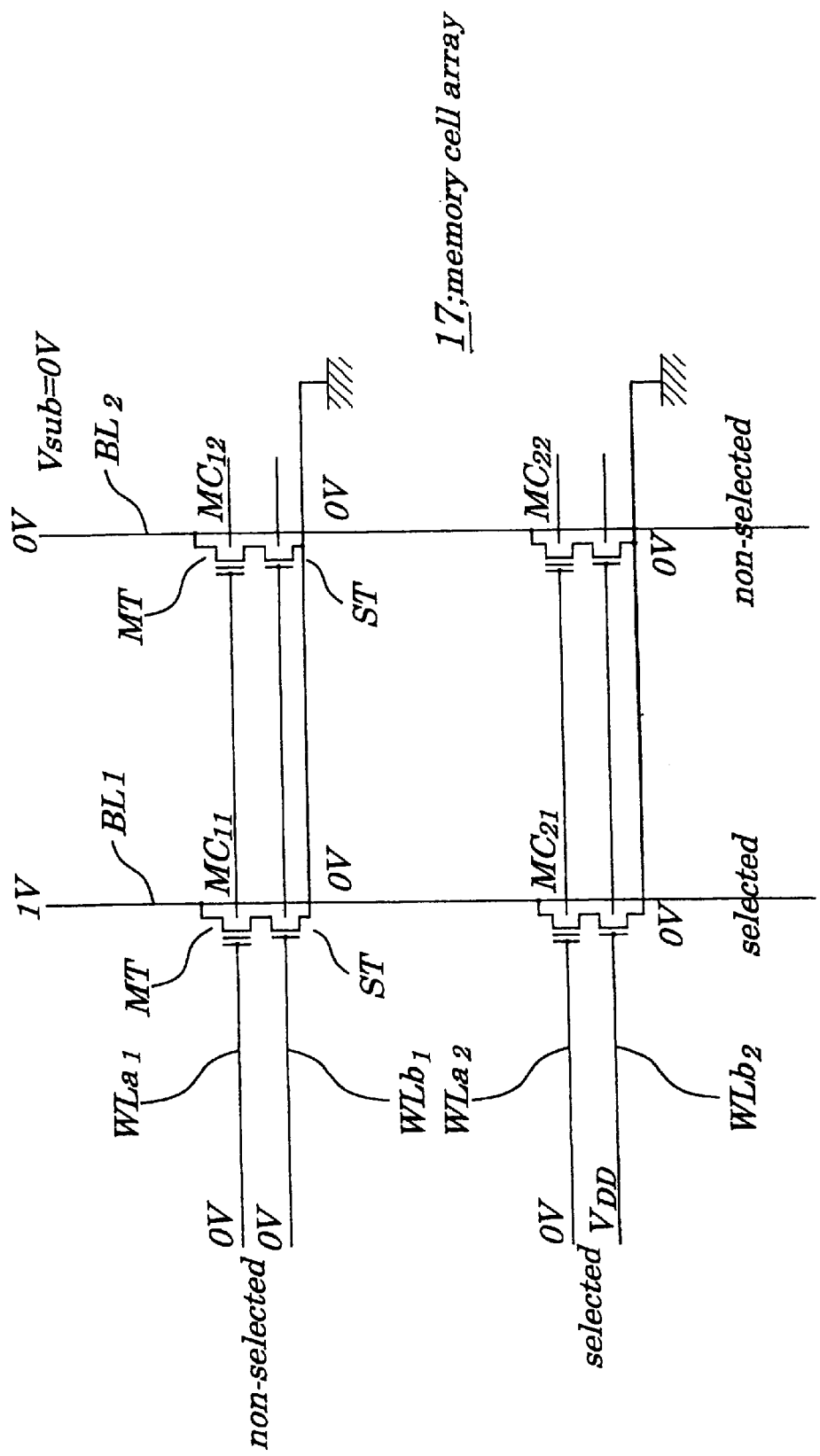
FIG. 7 is a wiring diagram showing a state of potentials at the time of reading in the memory cell.

FIG. 1 is a block diagram showing electrical configurations of a non-volatile semiconductor memory device according to a first embodiment of the present invention. FIG. 2 is a wiring connection diagram of a high voltage control circuit and a normal voltage circuit as gate power supply circuits constitutes the non-volatile semiconductor memory device. FIG. 3 is a cross-sectional view of a configuration of layers of a memory cell used for the non-volatile semiconductor memory device. FIG. 4 is a chart showing a state of potentials of each terminal of the memory cell corresponding to each operational mode for writing and deleting in the non-volatile semiconductor memory device. FIG. 5 is a wiring diagram showing a state of potentials at the time of erasing in the memory cell. FIG. 6 is a wiring diagram showing a state of potentials at the time of writing in the memory cell. FIG. 7 is a wiring diagram showing a state of potentials at the time of reading in the memory cell.

The non-volatile semiconductor memory device according to this embodiment relates to a flash memory which can electrically erase a set of stored data, approximately consisting of, as shown in FIG. 1, a memory cell array 17, a row address buffer 18, a row decoder 19, a row driver 20, a column address buffer 21, a column decoder 22, a column selector 23, a sense amplifier circuit 24, a writing circuit 25 and a control circuit 26.

First, the memory cell array 17 is hereafter described. According to this embodiment, the memory cell array 17, as shown in FIG. 1, is composed of more than one pair of word lines ($WLa_1$ and $WLb_1$), . . . ($Wla_n$ and $Wlb_n$) and two or more bit lines ($BL_1$, $BL_2$, . . . $BL_k$), and two or more (n×k) non-volatile memory cells $MC_{11}$, $MC_{12}$, . . . $MC_{nk}$ disposed at the point of intersection of each pair of word lines and bit lines. As depicted in FIG. 3, each of memory cells $MC_{11}$ to $MC_{nk}$ is composed of a MOS-type two-device component consisting of a stacked-gate type memory transistor MT having a control gate 27 and a floating gate 28 and a switch transistor ST having a switching gate 30 connected in series to a source 29 of the memory transistor MT. Moreover, though the thickness of a gate oxide film disposed below the switching gate 30 is shown to be great in the drawing, it may be the same as that of a tunnel oxide film disposed below the floating gate 28 (the same in other similar drawings).

The memory transistor MT, in a data-erased state, is a depletion-type n-channel MOS transistor in which a drain current flows even if power is not applied to the control gate, while the switch transistor ST is an enhancement-type n-channel MOS transistor in which a drain current would not flow till a gate voltage being higher than a threshold voltage is applied.

As seen in FIG. 1 and enlarged FIGS. 5 to 7, each pair of the word lines is composed of a pair made of first word lines $WLa_1$ to $WLa_n$ and second word lines $WLb_1$ to $WLb_n$. Each first word line $WLa_i$ is connected to each control gate 27 of k units of memory cells $MC_{i1}$ to $MC_{ik}$ arranged along the first word line $WLa_i$. Each second word line $WLb_j$ is connected to each switching gate 30 of k units of memory cells $MC_{j1}$ to $MC_{jk}$ arranged along the second word line $WLb_j$. Each bit line $BL_m$ is connected to a drain 31 of n units of memory cells MC1m to MCnm arranged along the bit line $BL_m$ (see FIG. 3). Moreover, for simplicity of description, in the embodiment, one bit (one memory cell) is selected for one address input.

Next, the row address buffer 18 operates to cause a row address signal RAD out of inputted address signals to be buffered and inputted to the row decoder 19. The row decoder 19 is composed of a normal voltage circuit 33, as shown in FIG. 2, and operates to decode the row address signal RAD inputted and to select two row selection lines forming a pair, out of "n" pieces of the row selection lines corresponding to "n" pieces of the second word lines $WLa_1$ to $WLa_n$ and of the first word lines $WLb_1$ to $WLb_n$ and then to output a supply voltage pulse (5V in this embodiment).

At the time of the reading operations, as shown in FIG. 7, when any one of the second word lines $WLb_j$ is selected by the row decoder 19, the switching gates 30 of the memory cells $MC_{i1}$, . . . $MC_{ik}$ to cover one line, which are to be connected to the word line $WLb_j$, are driven and the corresponding switch transistor ST is turned ON. At this point, to the switching gates 30 of the memory cells connected to non-selected second word lines is applied a voltage of 0 volts causing the corresponding switch transistor ST to be turned OFF.

The row driver 20, as shown in FIG. 2, is composed of "n" pieces of high voltage control circuits 32 used to apply a high voltage to memory transistors, each of the high voltage control circuits being connected to each of the first word lines $WLa_1$ to $WLa_n$ and of "n" pieces of normal voltage circuits 33 used to apply power to switch transistors, each of the normal voltage circuits being connected to each of the second world lines $WLb_1$ to $WLb_n$. The high voltage control circuit 32, when any one of row selection lines is selected by the row decoder 19, outputs high voltage pulses (16V in this embodiment) for selection to the corresponding first word line WLa1 to energize the corresponding control gate 27 and, as explained later, by injecting electrons to the floating gate 28 by FN tunnel currents or not injecting the same, writes a "0" or a "1".

At this point, the high voltage control circuit 32 outputs a high voltage pulse (8V in this embodiment) for non-selection to an non-selected first word line, the voltage of which is lower than the high voltage of 16V for selection and higher than the normal power supply voltage of 5V, with the same timing as for the high voltage pulse for the selection, in order to energize the control gate 27 for non-selection so that no writing on an non-selected memory cell takes place. Moreover, in the writing operation mode, as shown in FIGS. 4 and 6, a voltage of 0 V is applied to the switching gates 30 of all memory cells $MC_{11}$ to $MC_{nk}$, causing all switch transistors to be in the OFF state.

Furthermore, during the reading operation, the high voltage control circuit 32 is turned OFF and a voltage of 0 V is applied to control gates 27 of all memory cells $MC_{lm}$ to $MC_{nm}$. In the erasing operation mode, the high voltage control circuit 32, as shown in FIGS. 4 and 5, is adapted to apply a negative high voltage (–16V in this embodiment) to control gates 27 of all memory cells $MC_{11}$ to $MC_{nk}$. The normal voltage circuits 33 used to apply voltage to the switch transistors are driven at the time of erasing data so as to apply a power supply voltage VDD of 5 V to the switching gates 30 of all memory cells $MC_{11}$ to $MC_{nk}$.

The column address buffer 21 is used to buffer a column address signal CAD of inputted address signals and then to input it to the column decoder 22. The column decoder 22 is used to decode inputted column address signals CAD and then to select one column line out of k-pieces of column lines $CL_1$ to $CL_k$. The column selector 23 contains k-pieces of transistors $Tc_1$, $Tc_2$, . . . $T_{ck}$ to be used as transfer gates corresponding to column lines CL1 to CLk and to bit lines BL1 to BLk. Each of transistors $Tc_1$ to $T_{ck}$ opens its gate when one column line $CLb_j$ is selected and connects the corresponding selection bit line $BLb_j$ to the data line DL. The sense amplifier circuit 24 is adapted to perform sense amplification of read data between data lines DL and external output data lines. That is, in the reading operation, when one column line $CLb_j$ corresponding to a column address signal CAD is selected, the transistor $T_{cj}$ used as a transfer gate connected to the column line is turned ON and the bit line $BLb_j$ is selected, while, when the second word line $WLb_j$ is selected by the row decoder 19, the selected memory cell $MC_{jm}$ is connected through the data line DL to the sense amplifier circuit 24. Then, data written on the selected memory cell $MC_{jm}$ is detected and amplified by the sense amplifier circuit and is outputted from the output data line.

The writing circuit 25 is adapted to perform amplification of writing data between the bit lines BL1 to $BL_k$ and the external input data lines. Specifically, in the writing operation, when one word line (first word line) $WLa_i$ corresponding to the row address signals RAD is selected, each of k-pieces of selected memory cells $MC_{il}$ to $MC_{ik}$ connected to the word line is connected through the bit lines $BL_1$ to $BL_k$ to the writing circuit individually. Then, the writing data covering k-pieces of the selected memory cells supplied through the input data line is written simultaneously to the selected memory cells $MC_{il}$ to $MC_{ik}$ covering one line of the word lines through the bit lines $BL_1$ to $BL_k$. As shown in FIG. 6, if a "0" is to be written to a selected memory cell, a voltage of 0 V is inputted through a corresponding bit line to a drain terminal of a corresponding memory cell and, if a "1" is to be written to a selected memory cell, a voltage of 6 V is inputted through a corresponding bit line to a drain of a corresponding memory cell.

Also, the control circuit 26 is adapted to feed appropriate timing signals and the like to each device. In this embodiment, semiconductor substrates and source electrodes of memory cells $MC_{il}$ to $MC_{ik}$ are grounded.

Operations of the device according to this embodiment will be hereafter described by referring to FIGS. 5 to 7.

In FIGS. 5 to 7, for simplicity, a memory array 17 composed of only four memory cells $MC_{11}$, $MC_{12}$, $MC_{21}$ and $MC_{22}$ arranged in two lines and two rows is shown.

(a) Erasing Operations

Figure 8A:
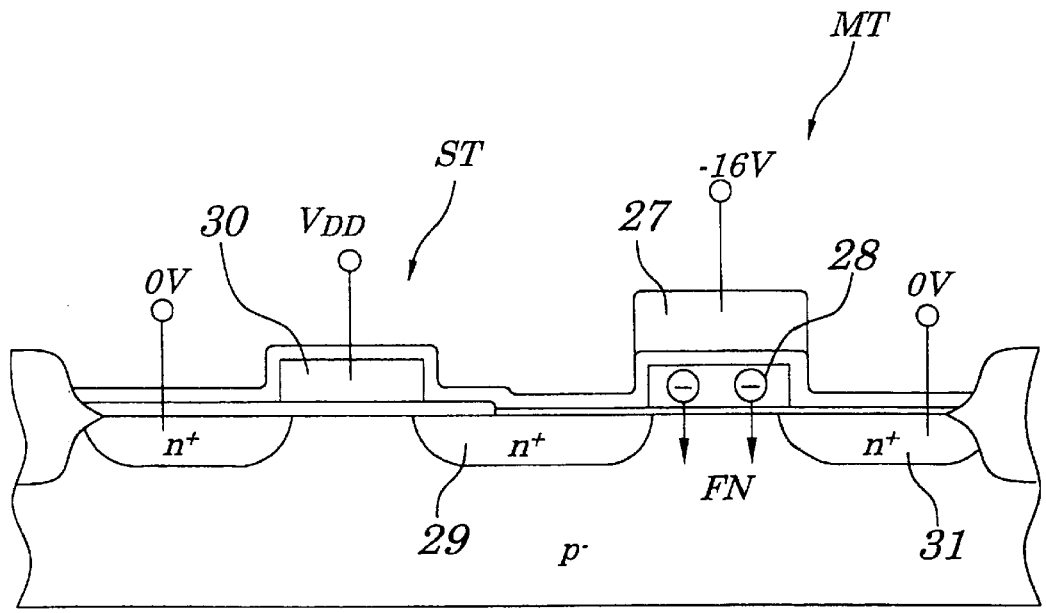
FIGS. 8A and 8B are cross-sectional views illustrating erasing operations according to the first embodiment.
Figure 8B:
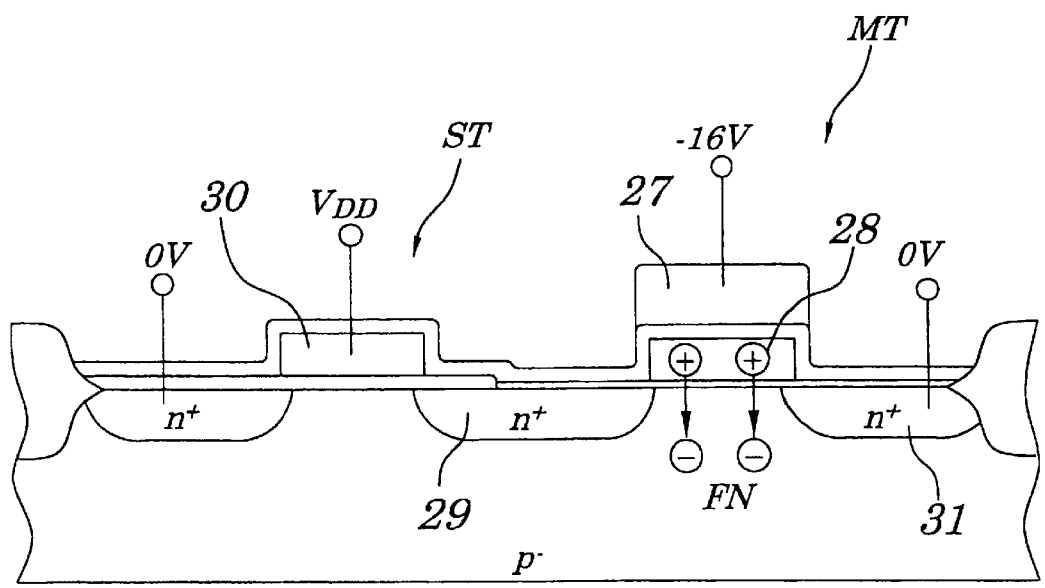

In order to erase, by one operation, data from the four memory cells $MC_{11}$, $MC_{12}$, $MC_{21}$ and $MC_{22}$, as shown in FIG. 5, regardless of whether any one of these four memory cells is selected or not selected, the normal voltage circuit 33 is driven to apply a power supply voltage VDD to the switching gates 30, with all the drain voltage Vd, source voltage Vs and substrate voltage $V_{SUB}$ held at 0 V, while the high voltage control circuit 32 is driven to apply a negative voltage of –16 V to the control gates 27. This causes a potential difference of 16 V between substrates of all memory cells $MC_{11}$, $MC_{12}$, $MC_{21}$ and $MC_{22}$ and the control gates 27. If, therefore, electrons are accumulated in the floating gate 28 of each of memory cells $MC_{11}$ to $MC_{22}$, the accumulated electrons are attracted by FN tunnel currents from the whole lower face of the floating gate 28 through a thin gate oxide film toward a semiconductor region disposed immediately below the film (see FIG. 8A). The attraction of electrons is excessively performed until the electron changes past a neutral state causing the floating gate 28 to be positively charged and the memory transistor is changed to be of a depletion type and thus the erasing operation is complete causing the state to be a "1" (see FIG. 8B).

In the erasing operation, the lower face of the floating gate 28 is disposed opposite to the semiconductor region, with the thin gate oxide film interposed between them.

Additionally, the switch transistor ST is turned ON which causes a source region 9 of the memory transistor MT to be at a potential of 0 V. Because a voltage of 0 V is also applied to the drain terminal there is no disturbance in an electric field between the semiconductor region (surface layer of the semiconductor substrate), an overlapped region (of the drain region 31, the source region 29 and the gate oxide film) and the floating gate 28. Therefore an approximately uniform parallel field is obtained. As a result, a uniform attraction of electrons by FN tunnel currents takes place over the whole bottom face of the floating gate 28.

According to this embodiment, partially local attraction of electrons from the floating gate can be avoided at the time of erasing operations. Owing to the uniform attraction of electrons on the whole bottom face, local damage to the gate oxide film can be prevented, thus making for a long life device. The attraction of electrons by FN tunnel currents on the whole bottom face of the floating gate also allows the reduction in power consumption and high speed erasing operations.

Figure 9:
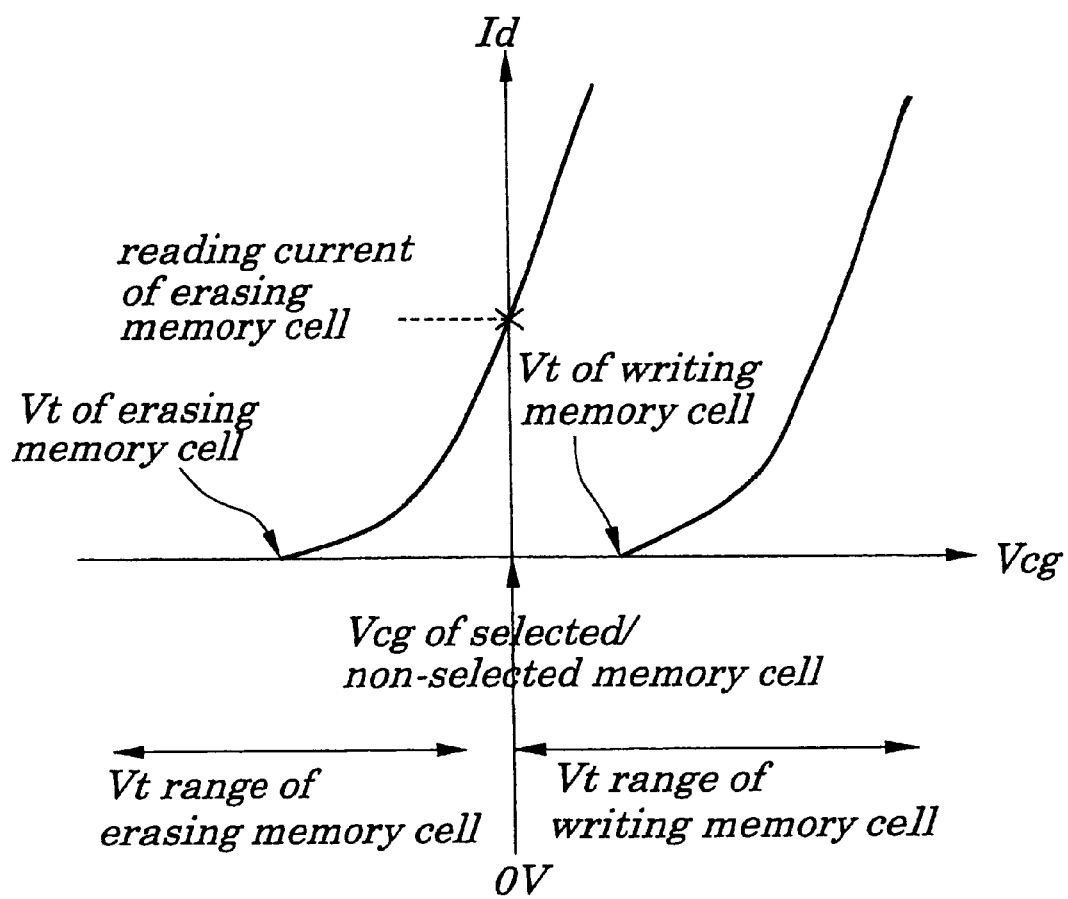
FIG. 9 is a diagram of a control gate voltage—drain current used to illustrate effects of erasing operations in the first embodiment.

Moreover, owing to a depletion-type erasing operation, no problems of over-erasing or over-writing exist. Accordingly, as shown in FIG. 9, the threshold voltage Vt of the erasing memory cell in the range for lower voltages has no limit on the operation of a circuit. This eliminates the need for controlling to narrow the threshold voltage Vt of the erasing memory cell, thus providing ease of operation of the device.

(b) Writing Operations

Next, operations for writing are hereinafter described. The floating gates 28 of all memory cells $MC_{11}$, $MC_{12}$, $MC_{21}$ and $MC_{22}$ are positively charged and erasing is in a depletion mode. In this state, for example, if a 0 and a 1 are to be written to the memory cells $MC_{21}$ and $MC_{22}$ respectively, as shown in FIG. 6, regardless of whether any one of memory cells $MC_{11}$, $MC_{12}$, $MC_{21}$ and $MC_{22}$ is selected or not selected, with the switching gate voltage Vsg held at 0 V, the switch transistor ST being turned OFF and the source voltage Vs and substrate voltage $V_{SUB}$ held at 0 V. The first word line $WLa_2$, the lower one in the drawing, of two first word lines $WLa_1$ and $WLa_2$ is selected. A high voltage pulse of 16 V is applied to the control gate 27 connected to the first word line $WLa_2$. At the same time, a voltage of 8 V is applied to the control gate connected to the first word line WLa1, upper one in the drawing, of two non-selected first word lines. At this point, with the same timing, a voltage of 0 V is applied to the drain region of the corresponding memory cells $MC_{11}$ and $MC_{21}$ from the bit line $BL_1$, the left one in the drawing, of two bit lines $BLa_1$ and $BLa_2$. A voltage of 6 V is applied to the drain region of the corresponding memory cells $MC_{12}$ and $MC_{22}$ from the bit line $BL_2$, right one in the drawing, of the two bit lines $BLa_1$ and $BLa_2$. That is, when a 0 is written to the selected memory cell, a voltage of 0 V is applied to the drain terminal through the corresponding bit line $BL_1$. When a 1 is written, a voltage of 6 V is applied through the bit line $BL_2$. The writing state on each of memory cells $MC_{11}$, $MC_{12}$, $MC_{21}$ and $MC_{22}$ caused by above writing operations is as follows:

(1) Memory Cell $MC_{11}$ (No Writing)

When the control voltage Vcg is 8 V and the drain voltage Vd is 0 V at the time of writing, a depletion-type channel still exists in the semiconductor region disposed below the floating gate 28 and therefore the drain region 31 and the source region 29 of the channel layer and memory transistor MT are at the same potential of 0 V. This means that a potential difference between the drain region 31 of the substrate, the source region 29 of the memory transistor MT and the control gate 27 is uniformly 8V. However, in the film configuration of the memory cell provided herein, the potential difference being 8 V is not enough for effective injection of electrons, that is, no writing to the memory cell MC11 takes place.

(2) Memory Cell $MC_{12}$ (No Writing)

When the control voltage Vcg is 8 V and the drain voltage Vd is 6 V at the time of writing, a depletion-type channel still exists in the semiconductor region disposed below the floating gate 28 and, therefore, the drain region 31 and the source region 29 of the channel layer and memory transistor MT are at the same potential of 6 V. This means that a potential difference between the drain region 31 of the substrate, the source region 29 of the memory transistor MT and the control gate 27 is uniformly 2V. However, at a potential of 2V, the injection of electrons is not effectively performed, that is, no writing to the memory cell MC12 takes place.

(3) Memory Cell $MC_{21}$ (Writing of "0")

Figure 10A:
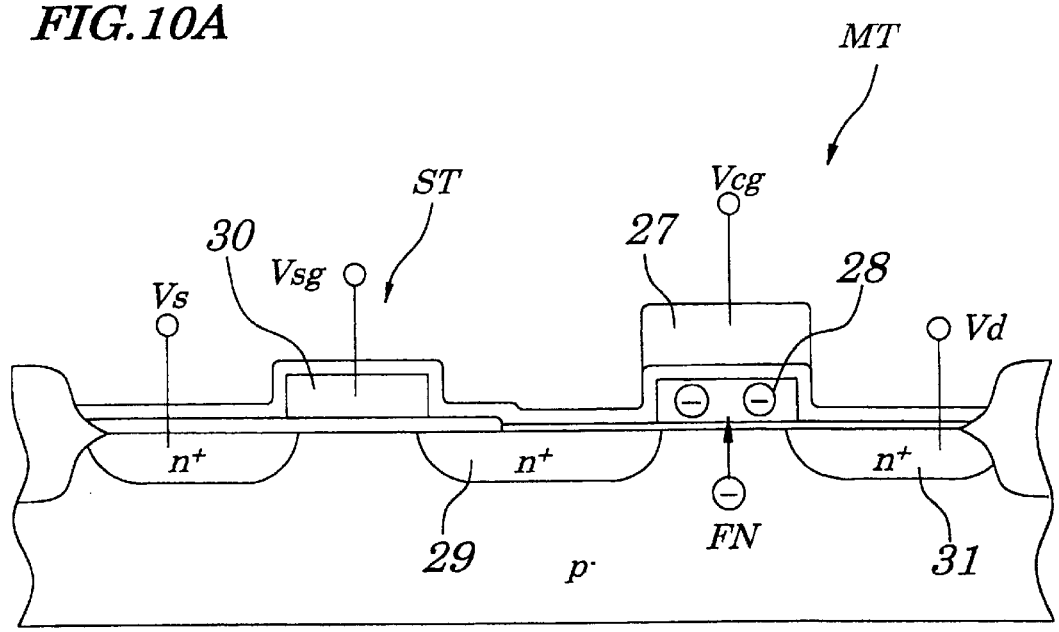
FIGS. 10A and 10B are cross-sectional views illustrating writing operations according to the first embodiment.

When the control voltage Vcg is 16 V and the drain voltage Vd is 0 V at the time of writing, a channel is formed in the semiconductor region disposed below the floating gate 28 and, therefore, the drain region 31 and the source region 29 of the channel layer and memory transistor MT are at the same potential of 0 V. This means that a potential difference between the drain region 31 of the substrate, the source region 29 of the memory transistor MT and the control gate 27 is uniformly 16V. However, at a potential being as large as 16 V, as shown in FIG. 10A, electrons are excessively injected by FN tunnel currents through the gate oxide film between the floating gate 28 and a channel. The electrons change past the neutral state causing the floating gate 28 to be positively charged. As a result, the memory transistor MT changes to be of an enhancement-type transistor having a high threshold value Vt, thus allowing the writing of "0".

(4) Memory Cell $MC_{22}$ (Writing of "1")

Figure 10B:
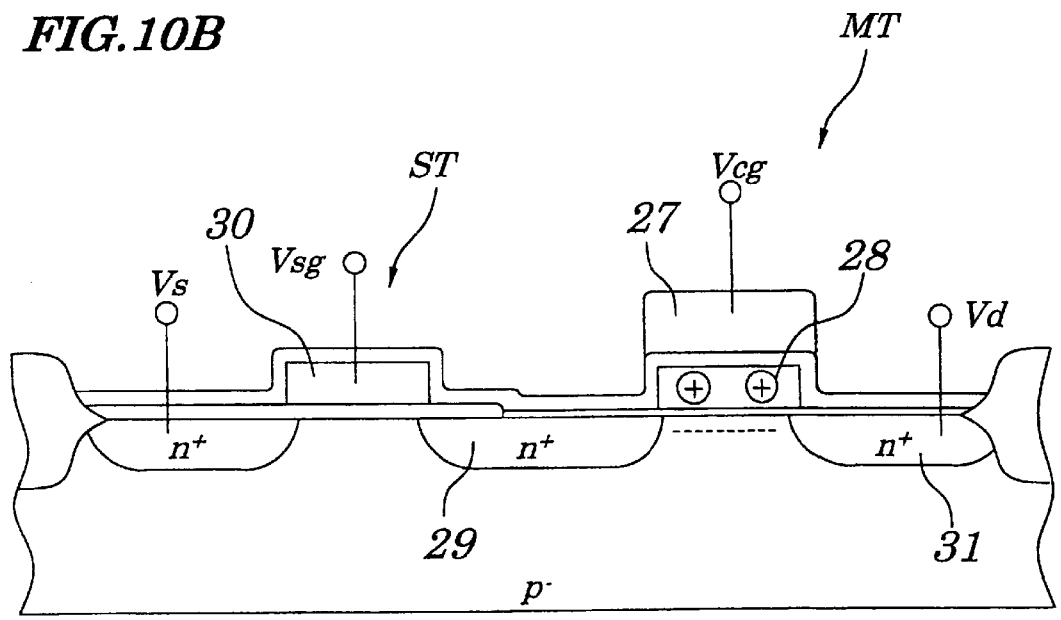

When the control voltage Vcg is 16 V and the drain voltage Vd is 6 V at the time of writing, a channel is formed in the semiconductor region disposed below the floating gate 28 and, therefore, the drain region 31 and the source region 29 of the channel layer and memory transistor MT are at the same potential of 6 V. This means that a potential difference between the drain region 31 of the substrate, the source region 29 of the memory transistor MT and the control gate 27 is uniformly 10 V. However, in the film configuration of a memory cell of this embodiment, as shown in FIG. 10B, no injection of electrons is effectively performed and a depletion-type state is held, thus allowing the writing of "1".

In the "0" writing operation, a bottom face of the floating gate is disposed opposite to the channel layer of 0 V, with the thin gate oxide film interposed between them. The memory transistor MT is turned ON, causing the source region 9 of the memory transistor MT and the drain region 31 to be at the same potential of 0 V. Accordingly, there is almost no disturbance in the electric field between the channel layer and overlapped region (of the drain/source region and the gate oxide film) and an approximately uniform parallel electric field is obtained. As a result, the injection of electrons by FN tunnel currents is performed over the whole bottom face of the floating gate 28. At this point, no attraction of electrons from the drain region (or the source region) takes place and no tunnel currents between bands will be produced.

According to this embodiment, partially local attraction of electrons from the floating gate can be avoided at the time of erasing operations. Owing to the uniform attraction of electrons on the whole bottom face, local damage to the gate oxide film can be prevented, thus making a longer life device and improving the capability being re-written in terms of numbers of times. Furthermore, the attraction of electrons by FN tunnel currents on the whole bottom face of the floating gate allows the reduction in power consumption and enables high speed erasing operations.

(c) Reading Operations

Next, in the reading operation mode, as shown in FIG. 7, regardless of whether any one of memory cells $MC_{11}$, $MC_{12}$, $MC_{21}$ and $MC_{22}$ is selected or not selected, the control gate voltage Vcg is 0 V and both the source voltage Vs and the substrate voltage $V_{SUB}$ are held at 0 V. The memory transistor MT, when in the erasing state, is in a depletion mode, even if the control gate voltage Vcg is 0 V, it remains ON. To read data from the memory cell MC21, the second word line $WLb_1$, lower one in the drawing, is selected and a power supply voltage pulse VDD is applied to the switching gate 30 connected to the second word line $WLb_1$, while the bit line $BL_1$, left one in the drawing, is selected and a voltage of 1 V is applied to the drain terminal. At this point, when a current is passed through the selected memory cell $MC_{21}$, since electrons are not accumulated at the floating gate 28, the state is judged to be a "1". While, if the current is not passed, since electrons are accumulated at the floating gate 28 and the threshold voltage Vt is high, the state is judged to be a "0".

Therefore, according to this embodiment, the low voltage control in the reading operations is performed not by the control gate 27 of the memory transistor MT, but by the switching gate 30 of the switch transistor ST, which enables high-speed reading.

In addition, only the high voltage control circuit 32 is connected to the first word lines $WLa_1$ to $WLa_n$ and the normal voltage circuit is not connected thereto. Only the normal voltage circuit 33 is connected to the second word lines $WLb_1$ to $WLb_n$ and the high voltage control circuit is not connected thereto. This eliminates the need for providing the same numbers of voltage relaxation circuits as those of the word lines, thus allowing the reduction both in the number and area of devices required for constructing the semiconductor memory.

Moreover, regardless of states of reading, selection or non-selection, since the control gate voltage is set to 0 V, the floating gate 28 is not subjected to a voltage stress, thus improving its data holding characteristics.

As described above, for example, the conventional floating gate becomes at a potential of −1 V when a "0" is written, while it becomes at a potential of +1 V when a "1" is written. Accordingly, if, for example, a voltage of 5 V is applied to the control gate of the selected memory cell for reading, the potential of the floating gate is changed from −1 V to 0 V and from +1 V to +2V. This means that the potential of the floating gate is changed in a wide range of −1 V to +2 V (see Table 1).

According to this embodiment, since the voltage of the control gate is fixedly set to 0 V, as shown in Table 2, the potential of the floating gate is changed in a narrow range of −1 V to +1 V and, furthermore, the voltage remains at a fixed level. Therefore, the floating gate is less subjected to static and dynamic stresses.

TABLE 2

|  | Non-selected | | Selected | |
| --- | --- | --- | --- | --- |
|  | "0" Writing | "1" Writing | "0" Writing | "1" Writing |
| Control gate | 0 | 0 | 0 | 0 |
| Floating gate | −1 | +1 | 0 | 0 |

Moreover, as shown in FIG. 9, as the threshold voltage Vt of the erasing memory cell in the range for lower voltages has no limit on the operation of a circuit, reading contrast can be improved.

Second Embodiment

The second embodiment of the present invention is hereafter described.

Figure 12:
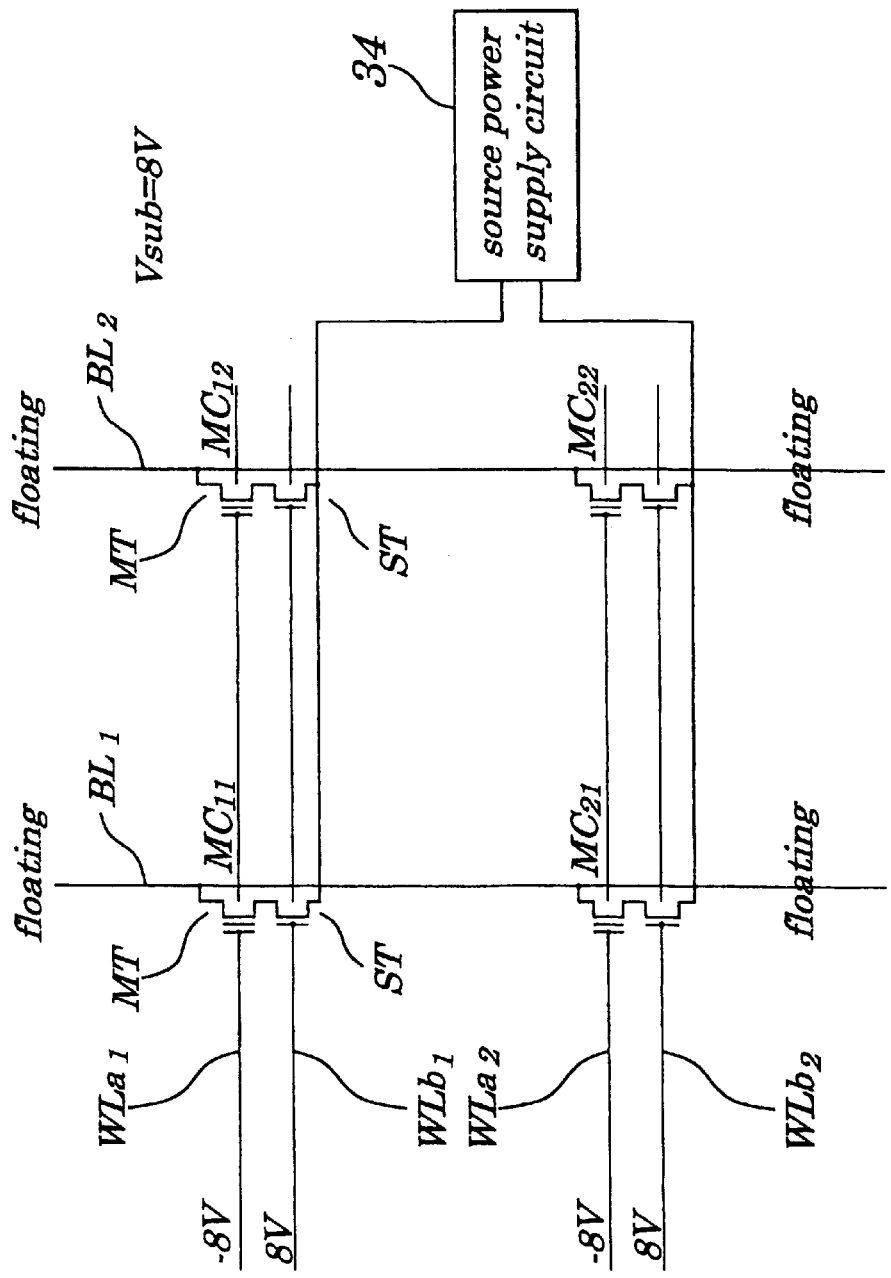
FIG. 12 is a wiring diagram showing potential states in erasing operations in the memory cells.
Figure 13:
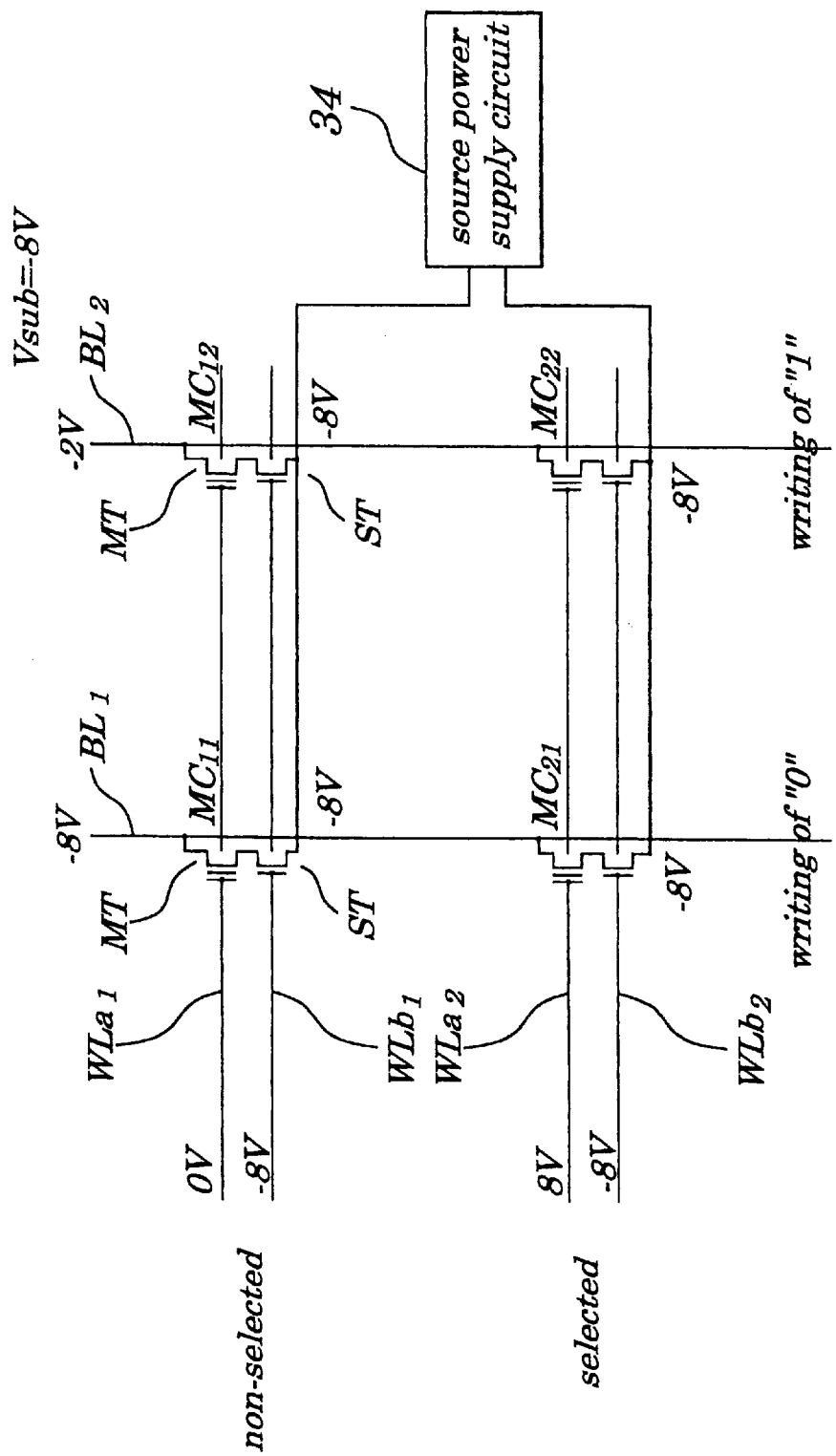
FIG. 13 is a wiring diagram showing potential states in writing operations.

FIG. 11 is a chart showing potential states of each terminal of memory cells corresponding to each operation mode for writing and erasing in a non-volatile semiconductor memory device according to a second embodiment of the present invention. FIG. 12 is a wiring diagram showing potential states in erasing operations in the memory cells. FIG. 13 is a wiring diagram showing potential states in writing operations.

The configuration in the second embodiment differs greatly from that in the first embodiment in that a source power supply circuit 34, shown in FIG. 12, is additionally provided to supply power to a source terminal of memory cells and that a voltage level at each terminal in erasing and writing operations is changed. Except those described above, the configurations in this embodiment are approximately the same as those shown in FIG. 1. Since the potential states in reading operations are also approximately the same as those in the first embodiment (see FIG. 7), description thereof is omitted. Only operations for erasing and writing in this embodiment are hereinafter described.

(a) Erasing Operation

To erase, by one operation, data from all memory cells $MC_{11}$, $MC_{12}$, $MC_{21}$ and $MC_{22}$ shown in FIGS. 11 and 12, regardless of whether any one of memory cells $MC_{11}$, $MC_{12}$, $MC_{21}$ and $MC_{22}$ is selected or not selected, with drain terminals and source terminals of all memory cells put in a floating state X and with substrate voltages $V_{SUB}$ and voltages of switching gates of all switch transistors ST held at 8 V, a voltage of −8 V is applied to control gates 27 of all memory transistors MT. This causes a potential difference of 16 V between substrates of all memory cells $MC_{11}$, $MC_{12}$, $MC_{21}$ and $MC_{22}$, and control gate 27. If electrons are accumulated in the floating gate 28 of each of the memory cells $MC_{11}$ to $MC_{22}$, the accumulated electrons are attracted by FN tunnel currents from the whole bottom face of the floating gate 28 through a thin gate oxide film in a semiconductor region (surface layer of the semiconductor substrate) disposed immediately below the film (see FIG. 8A). Furthermore, the attraction of the electrons by FN tunnel currents is excessively performed until the floating gate 28 is positively charged and the memory transistor is changed to be of a depletion type and thus the erasing operation is completed (see FIG. 8B).

At this point, since the drain terminals and the source terminals of all memory cells are put in the floating state X, the flow of currents does not take place between the floating gate 28 and the drain region 31 and the source region 29 of the memory transistor MT. Accordingly, the configuration according to this embodiment can also provide approximately the same effects in erasing operations as those described in the first embodiment.

(b) Writing Operation

The floating gate 28 of all memory cells $MC_{11}$, $MC_{12}$, $MC_{21}$ and $MC_{22}$ are positively charged and in a depletion-type erasing state. In this state, for example, if a "0" is to be written to the memory cell $MC_{21}$ and if a "1" is to be written to the memory cell $MC_{22}$, as shown in FIGS. 11 and 13, regardless of whether any one of memory cells $MC_{11}$, $MC_{12}$, $MC_{21}$ and $MC_{22}$ is selected or not selected, with the switching gate voltage Vsg set to −8V and the switch transistor being turned OFF and with the source voltage Vs and substrate voltage $V_{SUB}$ held at −8V, the first word $WLa_2$, lower one in the drawing, of the two first word lines WLa1 and $WLa_2$ is selected and a high voltage pulse of 8 V is applied to the control gate connected to the word line, while a voltage of 0 V is applied to the control gate connected to the non-selected first word line, upper one in the drawing. At this point, with the same timing in applying voltage as above, a voltage of −8 V is applied to the corresponding drain terminal from the bit line BL1, left one in the drawing, of the two bit lines BLa₁ and BLa₂ and a voltage of −2 V is applied to the drain terminals of corresponding memory cells $MC_{11}$ and $MC_{21}$, from the bit line $BL_2$, right one in the drawing. That is, to write a "0" to the selected memory cell, a voltage of −8 V is applied to the drain terminal through the bit line $BL_1$ of corresponding memory cells $MC_{12}$ and $MC_{22}$, while, to write a "1", a voltage of −2 V is applied to the drain terminal through the bit line BL2.

The writing state on each of memory cells $MC_{11}$, $MC_{12}$, $MC_{21}$ and $MC_{22}$ caused by above writing operations is as follows:

(1) Memory Cell $MC_{11}$ (No Writing)

When the control voltage Vcg is 0 V and the drain voltage Vd is −8 V at the time of writing, a depletion-type channel is formed in the semiconductor region disposed below the floating gate 28 and, therefore, the drain region 31 and the source region 29 of the channel layer and memory transistor MT are at the same potential of −8 V. This means that a potential difference between the drain region 31 of the substrate, the source region 29 of the memory transistor MT and the control gate 27 is uniformly 8V. However, in the film configuration of the memory cell provided herein, if the potential difference is 8 V, no effective injection of electrons is performed, that is, no writing to the memory cell $MC_{11}$ takes place.

(2) Memory Cell $MC_{12}$ (No Writing)

When the control voltage Vcg is 0 V and the drain voltage Vd is −2 V at the time of writing, a depletion-type channel is formed in the semiconductor region disposed below the floating gate 28 and, therefore, the drain region 31 and the source region 29 of the channel layer and memory transistor MT are at the same potential of −2 V. This means that a potential difference between the drain region 31 of the substrate, the source region 29 of the memory transistor MT and the control gate 27 is uniformly 2V. However, if the potential difference is 2 V, no effective injection of electrons is performed, that is, no writing to the memory cell $MC_{11}$ takes place.

(3) Memory Cell $MC_{21}$ (Writing of "0")

When the control voltage Vcg is 8 V and the drain voltage Vd is −8 V at the time of writing, a channel is formed in the semiconductor region disposed below the floating gate 28 and, therefore, the drain region 31 and the source region 29 of the channel layer and memory transistor MT are at the same potential of −8 V. This means that a potential difference between the drain region 31 of the substrate, the source region 29 of the memory transistor MT and the control gate 27 is uniformly 16V. However, at a potential being as large as 16 V, as shown in FIG. 10A, electrons are injected by FN tunnel currents, through the gate oxide film, between the floating gate 28 and the channel, causing the floating gate 28 to be positively charged and, as a result, the memory transistor MT changes to be an enhancement-type transistor, thus allowing the writing of "0".

(4) Memory Cell $MC_{22}$ (Writing of "1")

When the control voltage Vcg is 8 V and the drain voltage Vd is −2 V at the time of writing, a channel is formed in the semiconductor region disposed below the floating gate 28 and, therefore, the drain region 31 and the source region 29 of the channel layer and memory transistor MT are at the same potential of −2 V. This means that a potential difference between the drain region 31 of the substrate, the source region 29 of the memory transistor MT and the control gate 27 is uniformly 10V. However, in the film configuration of this embodiment, as shown in FIG. 10B, no effective injection of electrons is performed, the memory transistor MT remains in the depletion state, thus allowing the writing of "1".

Thus, each potential difference at the time of writing in this embodiment is the same as in the case of the first embodiment and, accordingly, the configuration according to this embodiment can also provide approximately the same effects in writing operations as those described in the first embodiment.

Third Embodiment

Figure 14:
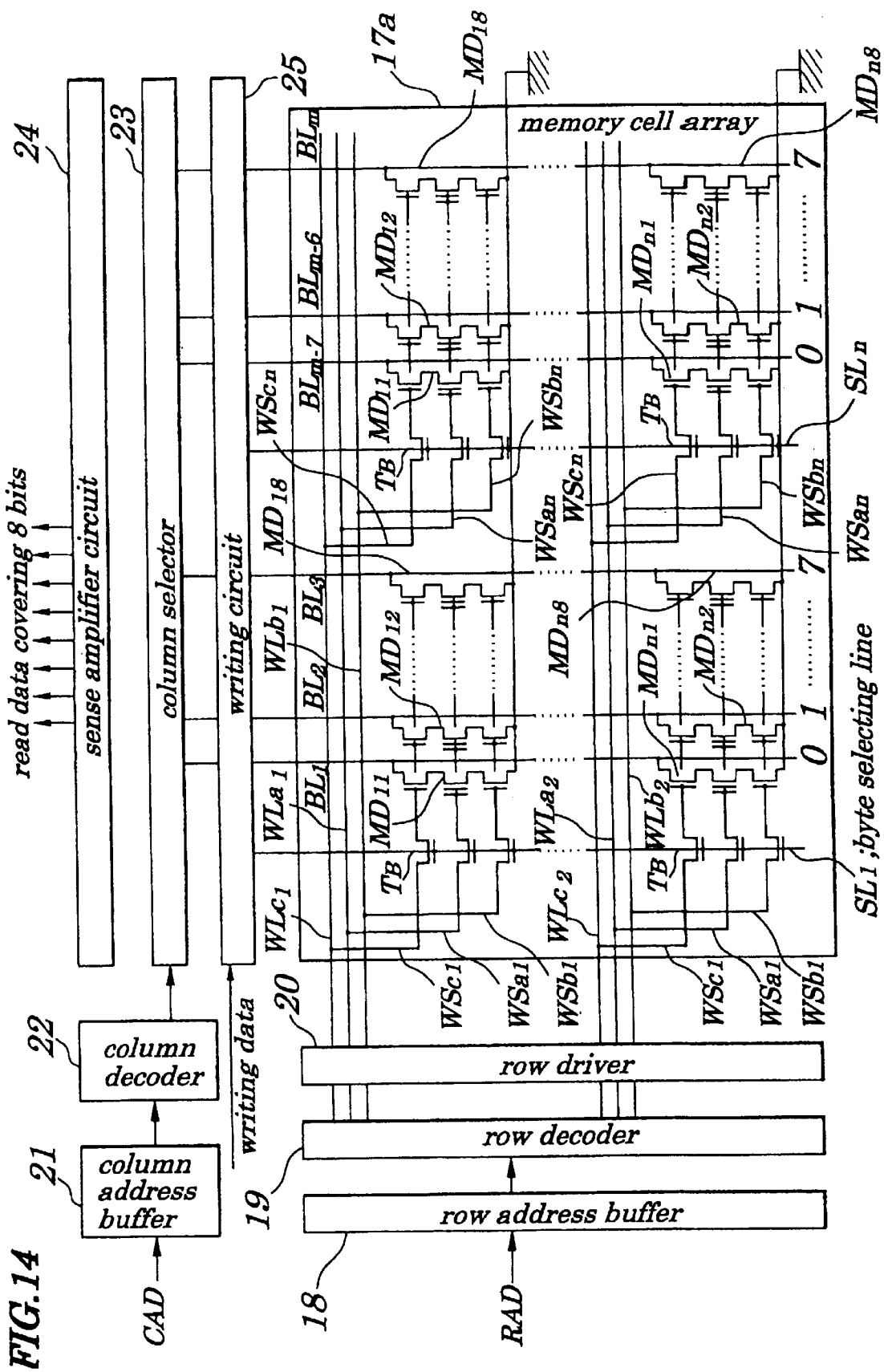
FIG. 14 is a block diagram showing electrical configurations of a non-volatile semiconductor device according to a third embodiment of the present invention.
Figure 15:
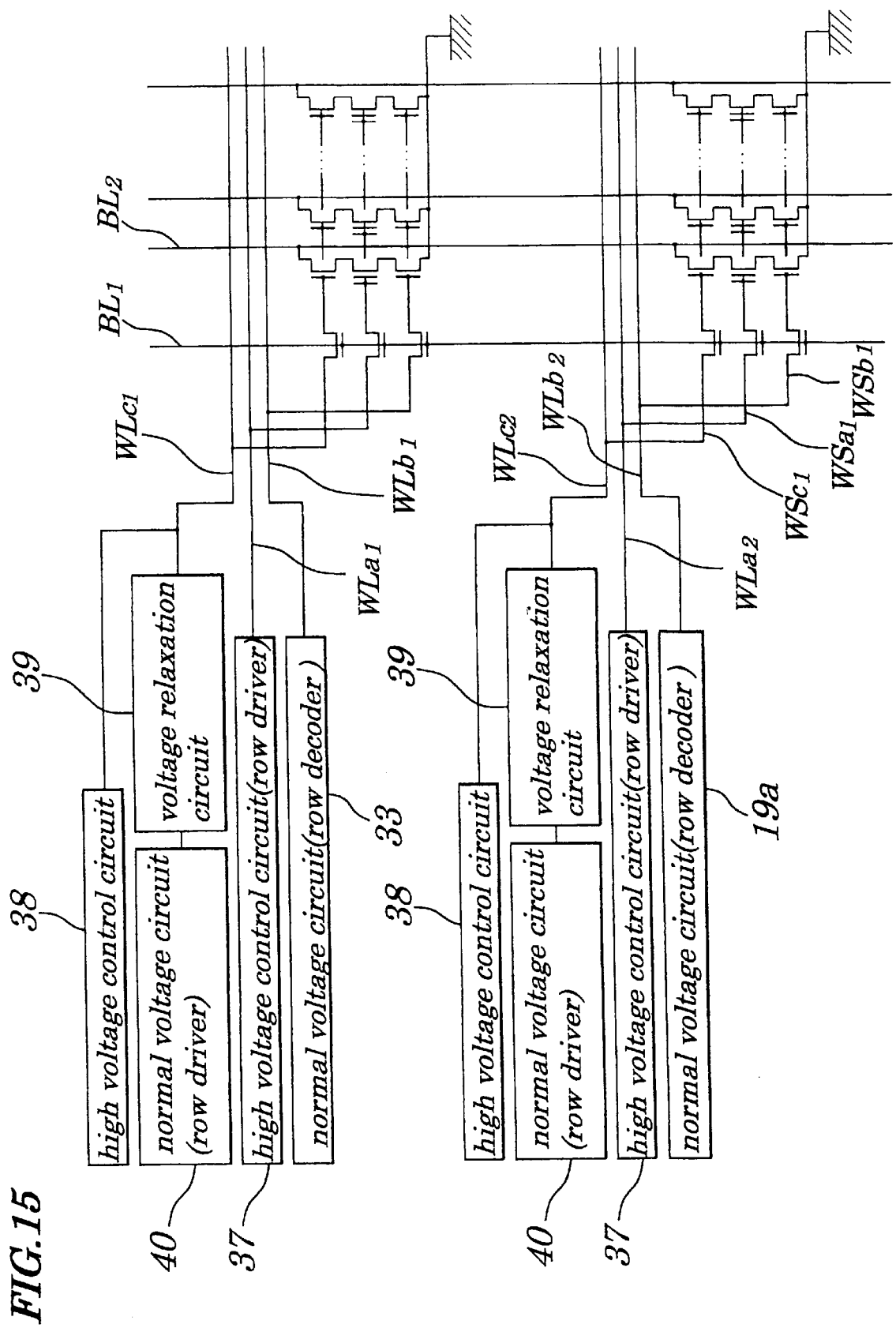
FIG. 15 is a wiring connection diagram of high voltage control circuits and normal voltage circuits used as gate power supply circuits constituting the non-volatile semiconductor device.
Figure 16:
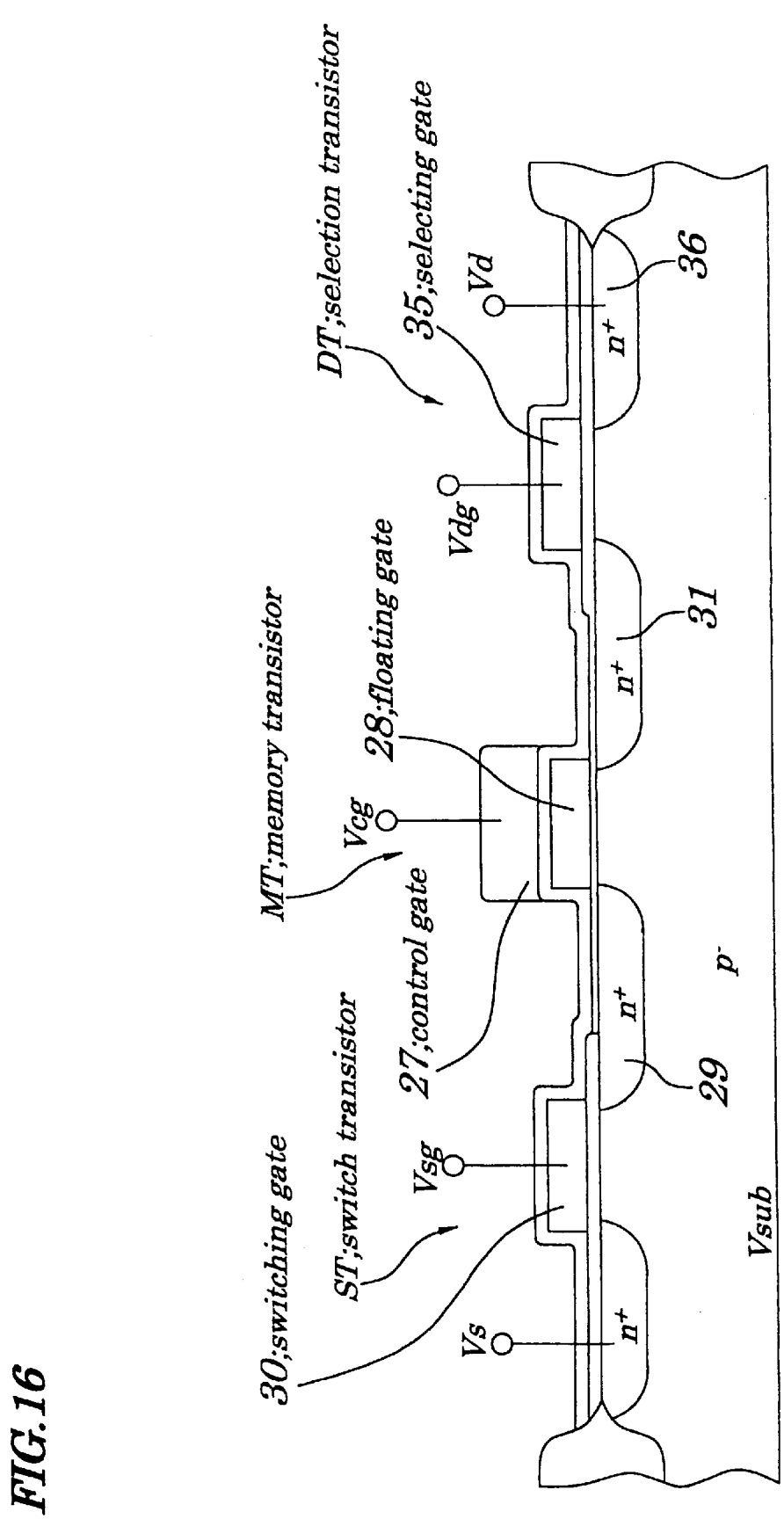
FIG. 16 is a cross-sectional view of a configuration of layers of a memory cell used for the non-volatile semiconductor memory device.
Figure 18:
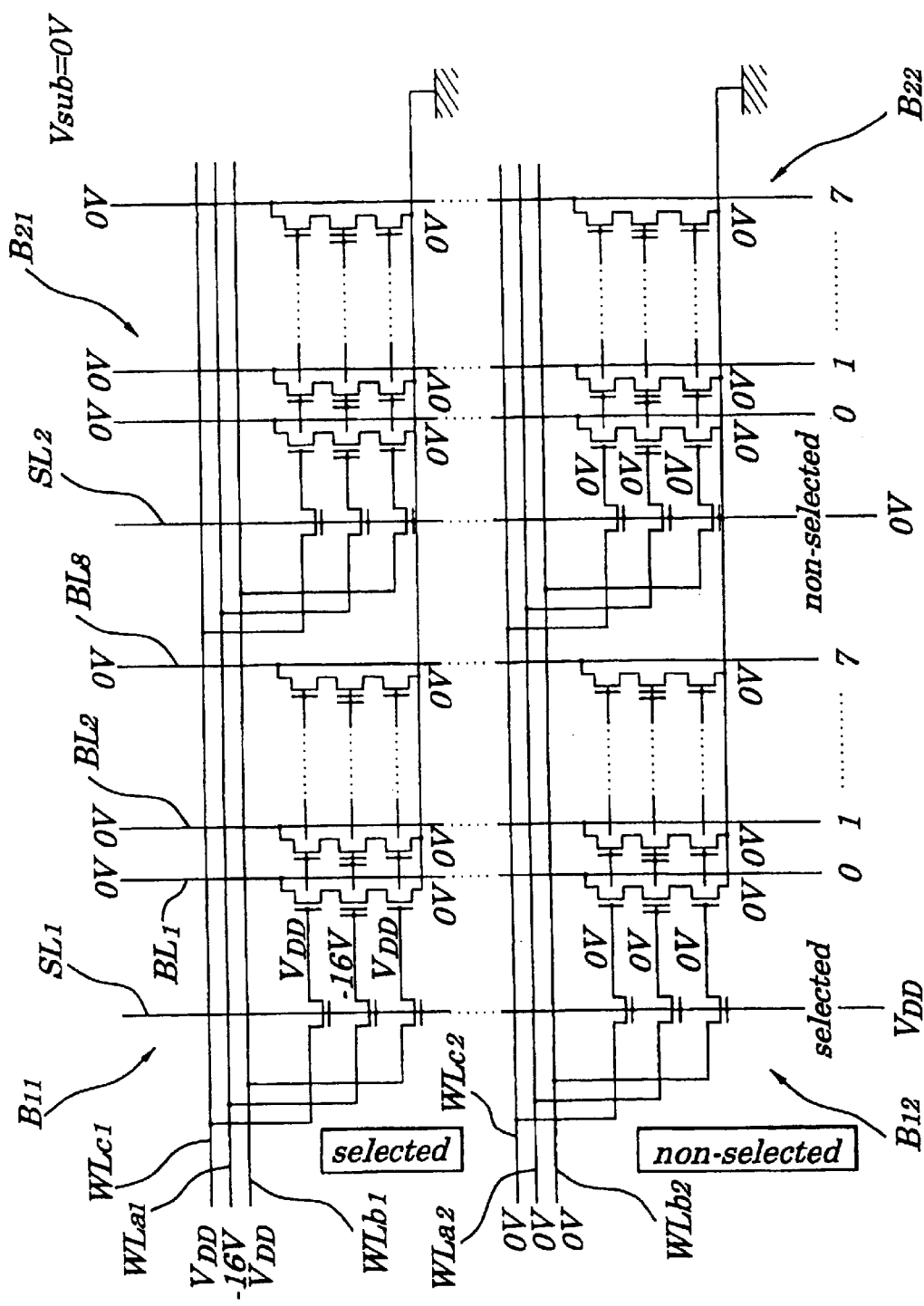
FIG. 18 is a wiring diagram showing potential states in erasing operations in memory cells constituting the non-volatile semiconductor memory device.
Figure 19:
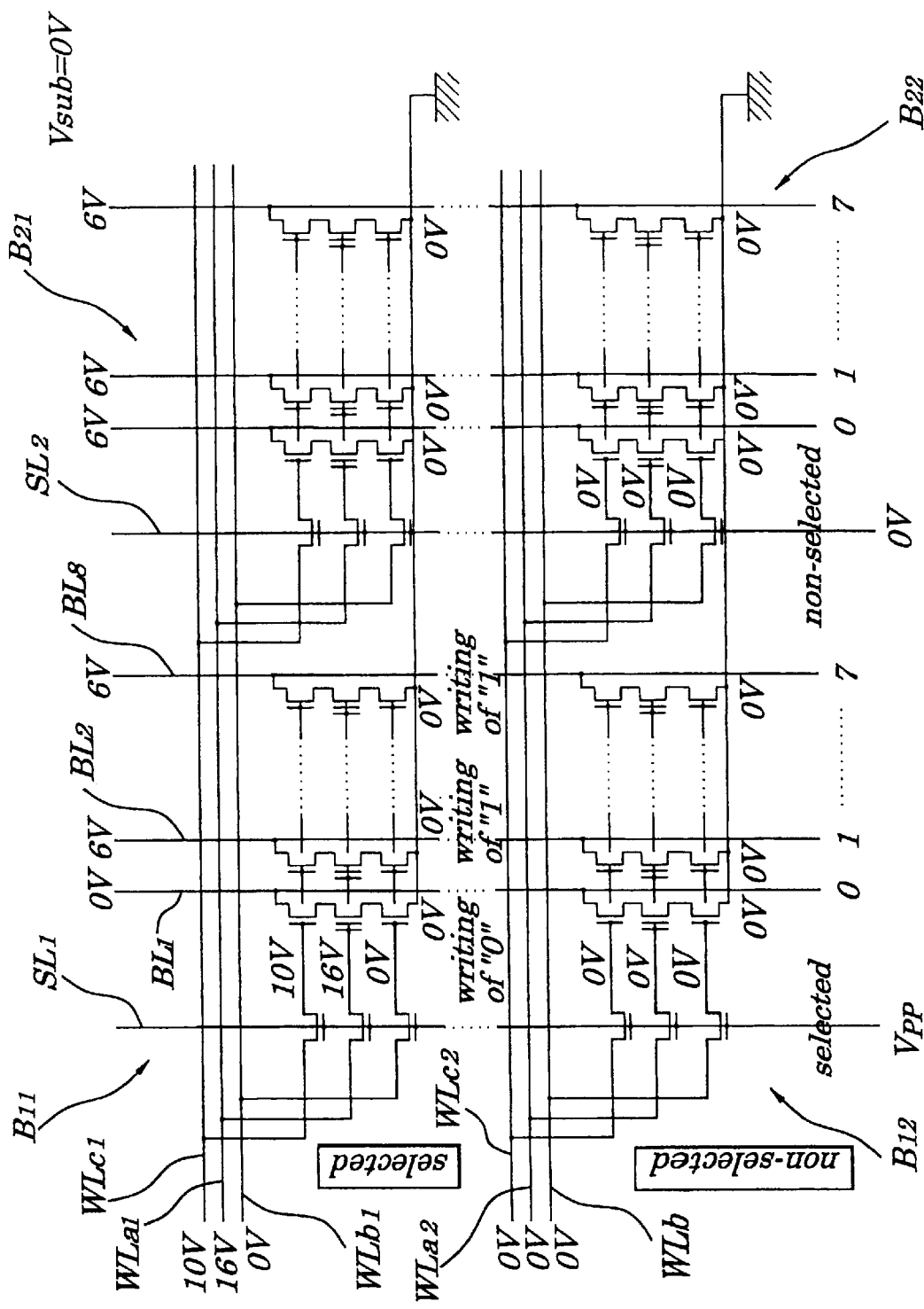
FIG. 19 is a wiring diagram showing potential states in writing operations.
Figure 20:
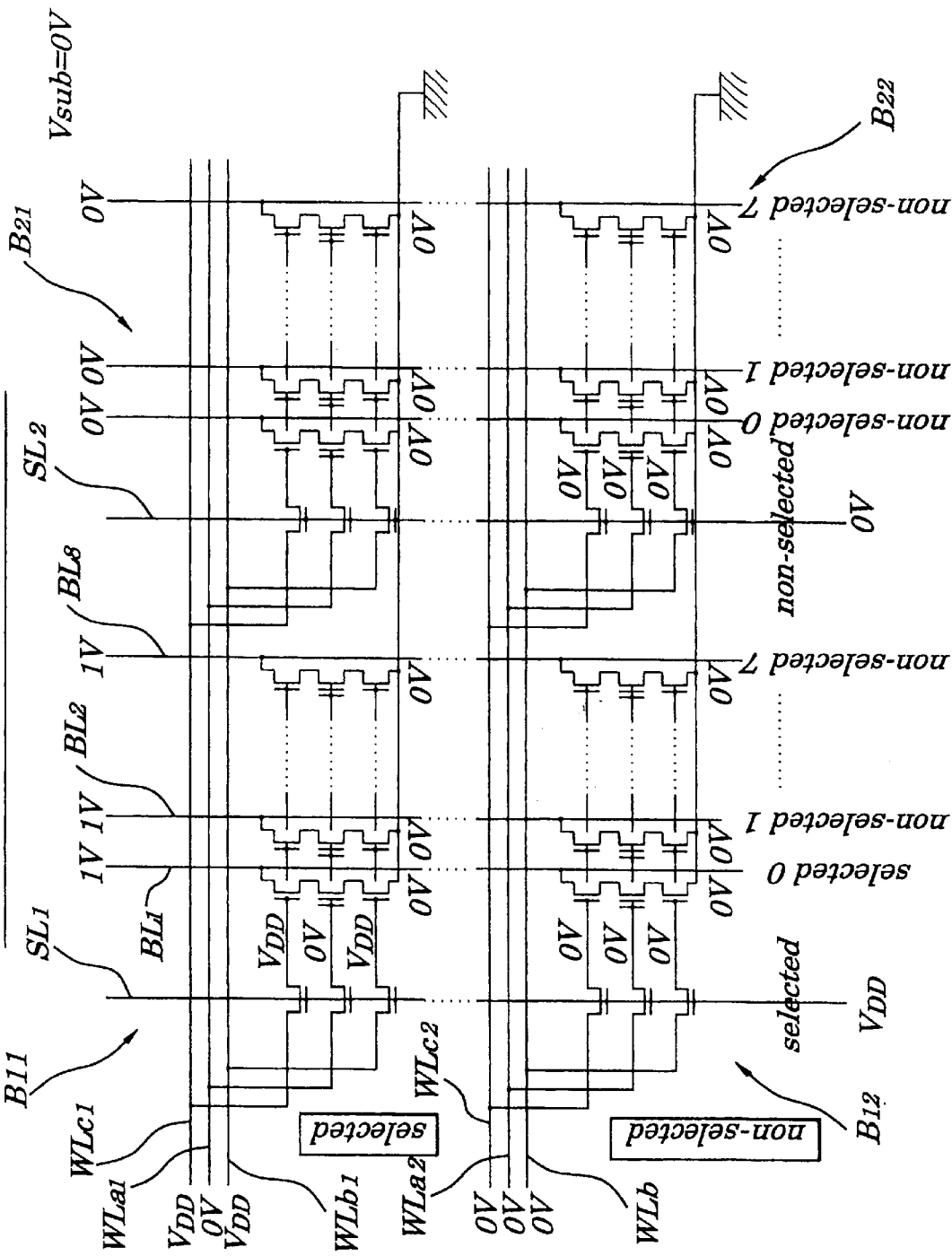
FIG. 20 is a wiring diagram showing potential states in reading operations.

FIG. 14 is a block diagram showing electrical configurations of a non-volatile semiconductor device according to a third embodiment of the present invention. FIG. 15 is a wiring connection diagram of high voltage control circuits and normal voltage circuits used as gate power supply circuits constituting the non-volatile semiconductor device. FIG. 16 is a cross-sectional view of a configuration of layers of a memory cell used for the non-volatile semiconductor memory device. FIG. 17 is a chart showing potential states of each terminal of memory cells corresponding to each operation mode for writing and erasing in the non-volatile semiconductor memory device. FIG. 18 is a wiring diagram showing potential states in erasing operations in memory cells constituting the non-volatile semiconductor memory device. FIG. 19 is a wiring diagram showing potential states in writing operations. FIG. 20 is a wiring diagram showing potential states in reading operations.

The configuration of the non-volatile semiconductor memory device according to this embodiment differs greatly from that in the first embodiment in that a two-device type memory cell is used in the first embodiment (see FIG. 3) and a three-device type memory cell is used in this embodiment (see FIG. 16).

The three-device type memory cell, as depicted in FIG. 16, is composed of three MIS-type devices consisting of a stacked gate type memory transistor MT having a control gate 27 and a floating gate 28, a switch transistor ST having a switching gate 30 connected serially to a side of a source 29 of the memory transistor and a selection transistor DT having a selecting gate 35 connected serially to a drain 31 of the memory transistor. The memory transistor MT is a depletion-type n-channel MOS transistor. The switch transistor ST is an enhancement-type n-channel MOS transistor. Moreover, in each drawing in the third embodiment, the same reference numbers are assigned to corresponding parts of the configurations in the drawings of the first embodiment and the description thereof is omitted accordingly.

The non-volatile semiconductor memory device according to this embodiment is related to an EEPROM being able to write and/or erase stored data electrically on a byte-by-byte basis and, as shown in FIG. 14, is approximately composed of a memory cell array 17a, a row address buffer 18, a row decoder 19, a row driver 20, a column address buffer 21, a column decoder 22, a column selector 23, a sense amplifier circuit 24, a writing circuit 25 and a control circuit (not shown).

The memory cell array 17a, as depicted in FIG. 14, consists of two or more sets of word lines ($WLa_1$, $WLb_1$, $WLc_1$), . . . ($WLa_n$, $WLb_n$, $WLc_n$), two or more bit lines $BL_1$, $BL_2$, . . . $BL_k$ and two or more (n×k pieces) non-volatile memory cells $MD_{11}$, $MD_{12}$, . . . $MD_{n(k-1)}$, $MD_{nk}$ disposed at the point of intersection of each set of the word lines and bit lines. The memory cell array 17a is divided into h blocks per one byte along each set of word lines, each block having 1×8 pieces of memory cells $MD_{j1}$ to $MD_{j8}$.

Each set of word lines, as shown in FIG. 14, contains a first set of main word lines $WLa_1$ to $WLa_n$, a second set of main word lines $WLb_1$ to $WLb_n$ and a third set of main word lines $WLc_1$ to $WLc_n$. Each of the first main word line $WLa_i$ has a first sub-word word line $WSa_i$ which is divided per each block (one byte). To the first sub-word line $WSa_i$ is connected control gate 27 of memory cells MDj1 to $MD_{j8}$ to cover 8 bits. Each of the second main word lines $WLb_j$ have a second sub-word word line $WSb_i$ which is divided per each block (one byte). To the second sub-word line $WSb_i$ is connected switching gate 30 of memory cells $MD_{j1}$ to $MD_{j8}$ to cover 8 bits. Each of the third main word line $WLc_j$ has a third sub-word word line $WSc_i$ which is divided per each block (one byte). To the third sub-word line $WSc_i$ is connected selecting gate 30 of memory cells MDj1 to MDj8 to cover 8 bits and to each of bit lines $BL_m$ is connected a drain 36 of n-pieces of memory cells $MD_{1m}$ to $MD_{nm}$ disposed along the bit lines $BL_m$. In this embodiment, 8 bits (8 memory cells) are selected per one address input. Transistors TB are interposed among sub-word lines $WSa_i$, $WSb_i$ and $WSc_i$ with numbers of the transistors and sub-word lines being taken to be 1:1. To n-pieces of byte selecting lines $SL_1$, $SL_2$, . . . $SL_n$ are connected n-pieces of gates for byte selection disposed along the byte selecting lines $SL_1$, $SL_2$, . . . $SL_n$.

Next, the above row address buffer 18 is adapted to buffer a row address signal RAD out of address signals inputted and to feed it to the row decoder 19. The row decoder 19 is composed of a normal voltage circuit 19a for selection (see FIG. 2) which decodes the inputted row address RAD and selects one of the second word lines $WLb_i$ and one of the third word lines $WLc_i$, which are paired with each other, and one of n-pieces of the row selection words corresponding to the first word lines WLa1 to $WLa_n$, and outputs a power supply voltage pulse of 5V.

The row driver 20 is composed of n-pieces of high voltage control circuits to apply a high voltage to memory transistors, each connecting to one of the first main word lines $WLa_1$ to $WLa_n$ and of n-pieces of high voltage control circuits 38 to apply a high voltage to a selected transistor, each connecting to one of the third main word lines $WLc_1$ to $WLc_n$ and of n-pieces of normal voltage circuits 40 to apply voltage to a selected transistor, each connecting, through a voltage relaxation circuit 39 to one of the third main word lines WLc1 to $WLc_n$.

The high voltage control circuits 37 (see FIG. 15) to apply a high voltage to memory transistors, in writing operations as shown in FIGS. 17 and 19, is adapted to output a high voltage pulse (16 V in this embodiment). When any one of the second word lines $WLb_i$ is selected by the row decoder 19 the first main word line $WLa_i$ is connected to the selected word line $Wlb_i$. Also at this time, it outputs 0 V to the non-selected first main word line. Moreover, the high voltage control circuit 37, in the erasing operations, as shown in FIGS. 17 and 18, outputs a high voltage, −16 V in this embodiment, to the selected first main word $WLa_i$, while, it outputs 0 V to the non-selected first main word line. Moreover, in the reading operations, the high voltage control circuit 37 is turned OFF.

Next, the high voltage control circuit 38 to apply a high voltage to selected transistors, in the writing operations, outputs a high voltage pulse, 10 V in this embodiment, to the selected third main word line $WLc_i$, and also it outputs 0 V to the non-selected third main word line, while, in the erasing and reading operations, as shown in FIGS. 18 and 20, the normal voltage circuits 40 are driven to output a power supply voltage pulse to the selected third main word line $WLc_i$ and to output 0 V to the non-selected third main word.

The column selector 23, as shown in FIG. 14, in accordance with address signals inputted, selects any one of h-pieces of byte selecting lines $SL_1$, $SL_2$, . . . $SL_h$ and drives corresponding transistors TB to open a gate for selection of bytes and to connect each of corresponding sub-word lines $WSa_i$, $WSb_i$ and $WSc_i$ with the first, second and third main word lines $WLa_1$ to $WLa_n$, $WLb_1$ to $WLb_n$ and $WLc_1$ to $WLc_n$.

Accordingly, when the high voltage control circuits 37 to supply power to memory transistors, as shown in FIG. 19, in the writing operations, output a high voltage pulse of 16 V to the selected first main word lines $WLa_i$, a voltage of 10 V is applied only to the first main word line $WLa_i$ selected by the column selector 23 and to a gate 34 for selection of the 8-bit transistor DT on the sub-word line connected thereto, thus turning ON the selection transistor DT. On the other hand, by the selection of the column selector 23, the non-selected first main word line and the selected transistor DT on the connected first sub-word line is turned OFF. Moreover, the column selector 23 selects, in the reading operations, 8 bits within one block simultaneously. Operations of the column address buffer 21, column decoder 22, sense amplifier circuit 24 and writing circuit 25 are the same as those in the first embodiment and their descriptions are omitted.

By referring to FIGS. 15, and 18 to 20, operations in this embodiment are hereinafter described. In FIGS. 18 to 20, the memory array is shown which is composed of four blocks B11, B12, B21 and B22 arranged in two lines and two rows where each of the blocks B11, B12, B21 and B22 contains 8 memory cells being equivalent to 8 bits.

(a) Erasing Operation

For example, to erase data from the block B11 shown at the upper-left corner of the drawing by one operation, as shown in FIG. 18, with the substrate voltage $V_{SUB}$ set to 0 V, regardless of whether any one of blocks B11 to B22 is selected or not, with the drain voltage Vd and the source voltage Vs of all memory cells $MD_{ij}$ maintained at 0 V, a set of word lines ($WLa_1$, $WLb_1$ and $WLc_1$) shown at the upper portion of the drawing and the byte selecting line SL1 shown at the left portion of the drawing are selected.

This selection can be achieved by applying a power supply voltage VDD to a gate 35 for selection for the set of word lines ($WLa_1$, $WLb_1$ and $WLc_1$) to be selected, −16 V to the control gate 27, a power supply voltage VDD to the switching gate 30 and a power supply voltage VDD to the selected byte selecting line SL1 respectively.

(1) Selected Block $B_{11}$ (Erasing)

Since the power supply voltage VDD is applied to the selecting gate 35 and the switching gate 30, all 8 selection transistors DT and switch transistors ST within the block $B_{11}$ are turned ON and, therefore, the voltage of the drain regions 31 and the source regions of all 8 memory transistors MT become 0 V which is at the same potential as the substrate voltage $V_{SUB}$. Therefore, the voltage being as high as 16 V is uniformly applied between the control gate and the semiconductor region and electrons are excessively and uniformly attracted, by FN tunnel currents, from the floating gate 28 within the selected block $B_{11}$ to the semiconductor region, causing the floating gate 28 to be positively charged and the memory cells covering one byte within the selected block $B_{11}$ to be in a depletion-type erasing state.

In this case, an approximate uniform electric field can be generated between the semiconductor regions (i.e., the surface layer of the semiconductor substrate) including overlapped regions (between the drain/source regions 31 and 29, and gate oxide films) and the floating gate 28 and, as a result, the attraction of electrons by FN tunnel currents occurs uniformly on the whole lower face of the floating gate takes place. Accordingly, in the configurations according to this embodiment, the same effects of erasing operations as those in the first embodiment can be obtained.

(2) Non-selected Block $B_{12}$ (No Erasing)

Though the byte selection line SL1 in the block $B_{12}$ is selected, because a voltage of 0 V is outputted from the non-selected first word line $WLa_2$, a voltage of 0 V is applied to the control gate 27 of all memory transistors MT within the block $B_{12}$. As a result, no potential difference between the control gate and the semiconductor region occurs and no injection of electrons by FN tunnel currents takes place.

(3) Non-selected Block $B_{21}$ (No Erasing)

Since the corresponding byte selection line SL2 is not selected in the block $B_{21}$, a voltage of −16 is not applied to the control gate of all memory transistors MT within the block $B_{21}$. No injection of electrons by FN tunnel currents takes place accordingly.

(4) Non-selected Block $B_{22}$ (No Erasing)

Similarly, since the corresponding byte selection line $SL_2$ is not selected in the block $B_{22}$, a voltage of −16 is not applied to the control gate of all memory transistors MT within the block $B_{22}$. No injection of electrons by FN tunnel currents takes place accordingly.

Thus, in the configuration according to this embodiment, approximately the same effects can be achieved as those in the first embodiment. In addition, it is possible to erase data by block (i.e., by byte). Moreover, the introduction of the selecting transistor or the byte selecting lines $SL_1$, $SL_2$ and the like can prevent a bad influence of, so-called, drain disturbance that erasing operations of selected blocks are affected by non-selected blocks.

(b) Writing Operations

For example, to write data to the block $B_{11}$ shown at the upper-left corner of the drawing, as shown in FIG. 19, with the substrate voltage $V_{SUB}$ set to 0 V, regardless of whether any one of blocks $B_{11}$ to $B_{22}$ is selected or not, with the source voltage Vs of all memory cells $MD_{ij}$ and the switching gate 30 maintained at 0 V, a set of word lines ($WLa_1$, $WLb_1$ and $WLc_1$) shown at the upper portion of the drawing and the byte selecting line $SL_1$ shown at the left portion of the drawing are selected.

(1) Selected Block $B_{11}$ (Writing of "0" or "1")

After a set of word lines ($WLa_1$, $WLb_1$ and $WLc_1$) shown at the upper portion of the drawing is selected, a power supply voltage of 10 V is applied to gates 35 for selection of all memory cells $MD_{ij}$ in the block $B_{11}$, a voltage of 16 V is applied to the control gates 27 and a power supply voltage VDD is applied to the switching gates 30. After the byte selecting line $SL_1$ is selected, a predetermined high voltage is outputted as well. Furthermore, a voltage of 0 V is applied to a bit line on which a "0" is written, out of 8 bit lines $BL_m$ within the block $B_{11}$ and a voltage of 6 V is applied to a bit line on which a "1" is written. This causes all selecting transistors ST within the block B11 to be turned ON. Since a channel is formed also in the memory transistors MT, if a voltage of 0 V is outputted from the bit line BL1, the voltage of the channel region and source/drain regions 29 and 31 of the corresponding memory transistors MT become 0 V which is at the same potential as that of the substrate voltage $V_{SUB}$. On the other hand, if a voltage of, for example, 6 V is outputted from the bit lines $BL_2$ and $BL_8$, the voltage of the channel region and source/drain regions 29 and 31 of the corresponding memory transistors MT become 6 V. Moreover, at this point, since the voltage Vsg of each of the switching gates is set to 0 V and the switch transistor ST is turned OFF, the drain current doe not flow. Therefore, when a voltage of 0 V is outputted from the bit line $BL_1$, because a voltage being as high as 16 V is applied between the control gate 17 and the semiconductor region including the channel, electrons are excessively injected by FN channel currents from the semiconductor region and, as a result, the electrons change past the neutral state and the floating gate is negatively charged. This causes the memory transistor to be of an enhancement type having a high threshold voltage Vt, and a "0" is written. If a voltage of 6 V is outputted from the bit lines $BL_2$ and $BL_8$, a voltage being as high as 10 V is applied between the control gate 17 and the semiconductor region having a channel. However, in the memory cell according to this embodiment, even when a voltage of 10 V is applied, since the effective injection of electrons does not take place, a "1" is written.

(2) Non-selected Block $B_{12}$ (No Writing)

In the block $B_{12}$, though the byte selecting line SL1 is selected, as the set of word lines ($WLa_2$, $WLb_2$ and $WLc_2$) is not selected, the voltage Vcg of the control gate of all memory cells $MD_{ij}$ within the block B11 becomes 0 V. Since no potential difference between the control gate 27 and the semiconductor region occurs, neither injection of electrons nor attraction takes place.

(3) Non-selected Block $B_{21}$ (No Writing)

In the block $B_{21}$, though the set of word lines ($WLa_1$, $WLb_1$ and $WLc_1$) is selected, as the byte selecting line $SL_2$ is selected, the voltage Vcg of the control gate of all memory cells $MD_{ij}$ within the block $B_{11}$ becomes 0 V. Since no potential difference between the control gate 27 and the semiconductor region occurs, neither injection of electrons nor attraction takes place.

(4) Non-selected Block $B_{22}$ (No Writing)

In the block $B_{22}$, because neither the byte selecting line $SL_1$ nor the set of word lines ($WLa_2$, $WLb_2$ and $WLc_2$) is selected, the voltage Vcg of the control gate of all memory cells $MD_{ij}$ within the block $B_{11}$ becomes 0 V. Since no potential difference between the control gate 27 and the semiconductor region occurs, neither injection of electrons nor attraction takes place.

This means that, in the configuration according to this embodiment, approximately the same effects can be achieved as those in the first embodiment. In addition, it is possible to write data by block (i.e., by byte). Moreover, the introduction of the selecting transistor or the byte selecting lines $SL_1$, $SL_2$ and the like can prevent the bad influence of, so-called, drain disturbance that writing operations of selected blocks are affected by non-selected blocks.

(b) Reading Operations

For example, to read data being equivalent to 8 bits from the block $B_{11}$ shown at the upper-left corner of the drawing, as shown in FIG. 20, with the substrate voltage $V_{SUB}$ set to 0 V, regardless of whether any one of blocks $B_{11}$ to $B_{22}$ is selected or not, with the voltage of the control gate and source voltage VS of all memory cells $MD_{ij}$ maintained at 0 V, a set of word lines ($WLa_1$, $WLb_1$ and $WLc_1$) shown at the upper portion of the drawing and the byte selecting line $SL_1$ shown at the left portion of the drawing are selected. The reading operations can be achieved by applying 1 V to bit lines $BL_1$ to $BL_8$ covering 8 bits corresponding to the selected block B11 and a voltage of 0 V to bit lines other than these, and by controlling the selecting gate voltage Vdg within the selected block $B_{11}$ and the switching gate voltage Vsg.

(1) Selected Block $B_{11}$ (Reading of "0" or "1")

When the byte selecting line SL1 is selected, to the selecting gate and the switching gate within the block $B_{11}$ is applied a power supply voltage VDD. At this point, in the memory cell being in the state of writing a "1", since the memory transistor MT is of a depletion type, all of the transistors DT, MT and ST are turned ON and, as a result, the memory cells become ON as a whole. Therefore, the drain current flows and a state "0" is read. In contrast, in the memory cell being in the state of writing a "0", as the threshold voltage Vt of the memory transistor is at a high level, the memory transistor MT remains in the OFF state. As a result, the memory cells become OFF as a whole. Therefore, the drain current does not flow and a state "0" is read out. Thus, all data being equivalent to 8 bits within the block $B_{11}$ can be read out by one operation.

(2) Non-selected Block $B_{12}$ (No Reading)

In the block $B_{12}$, though the byte selecting line $SL_1$ is selected, as the set of word lines ($WLa_2$, $WLb_2$ and $WLc_2$) shown at the lower portion of the drawing is not selected, the voltage of all the selecting gates and the switching gates within the block $B_{11}$ becomes 0 V. As a result, the memory cells as a whole become OFF and no reading occurs.

(3) Non-selected Block $B_{12}$ (No Reading)

In the block $B_{21}$, though the set of word lines ($WLa_1$, $WLb_1$ and $WLc_1$) shown at the upper portion of the drawing is selected, as the byte selecting line $SL_1$ is not selected, the voltage of all the selecting gates and the switching gates within the block $B_{21}$ becomes 0 V. As a result, the memory cells as a whole become OFF and no reading occurs.

(4) Non-selected Block $B_{22}$ (No Reading)

In the block $B_{22}$, because neither the byte selecting line SL1 nor the set of word lines ($WLa_2$, $WLb_2$ and $WLc_2$) is selected, the memory cells as a whole become OFF and no reading occurs.

Thus, in the configuration according to this embodiment, approximately the same effects can be achieved as those in the first embodiment. In addition, it is possible to read data by block (i.e., by byte). Moreover, the introduction of the selecting transistor or the byte selecting lines SL1, SL2 and the like can prevent the bad influence of, so-called, drain disturbance that reading operations of selected blocks are affected by non-selected blocks.

It is apparent that the present invention is not limited to the above embodiments but may be changed and modified without departing from the scope and spirit of the invention. For example, the potential and potential difference at each terminal (or electrode) of the memory cell are one of examples which can be changed if necessary. Not only an n-channel MOS but also a p-channel MOS may be used.

Moreover, in the above embodiments, the stacked-gate type memory transistor is employed, however, instead of this, a MIOS-type memory transistor may be used, the gate insulating film of which is composed of a first insulating film (e.g., $SiO_2$) on a lower layer and a second insulating film (e.g., $Si_3N_4$) on an upper layer and wherein carriers are accumulated in the trap surface in the second insulating film existing in the vicinity of an interface of these films.

Also, in the above third embodiment, two values of a "0" and a "1" are used for storing data and, at the time of reading, since the voltage of the control gate can be set to 0 V, the data holding characteristics can be greatly improved. As a result, because the storing state is made more stable, multivalued data of three values or more can be stored. Furthermore, in the above embodiments, when the memory transistor MT is of a depletion type, the stored state is defined to be a "1" while it is of an enhancement type, the state is defined to be a "0", however, they can be defined in a reverse manner.

In addition, in the above embodiments, the system is so configured that the reading, writing and erasing operations are carried out in units of a byte and therefore the byte selecting line is required, however, if it is configured so that only 8 memory cells are connected to a set of word lines, the transistor having byte connecting lines and byte selecting gates is not required.

Figure 21A:
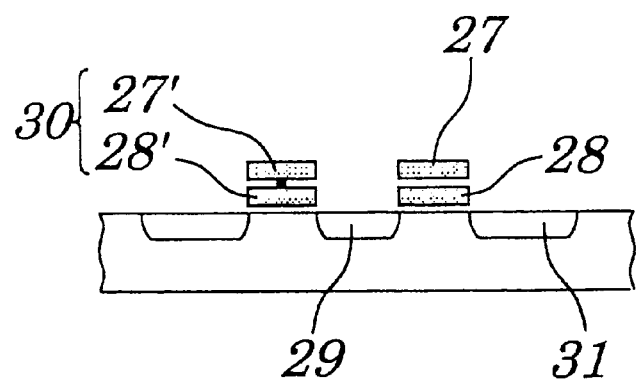
FIGS. 21A and 21B are explanatory diagrams illustrating one example of production methods for the non-volatile semiconductor memory device of the present invention.
Figure 21B:
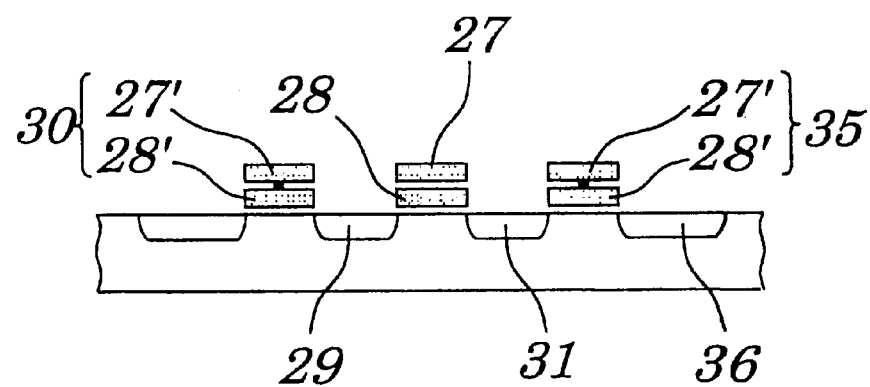
Figure 22A:
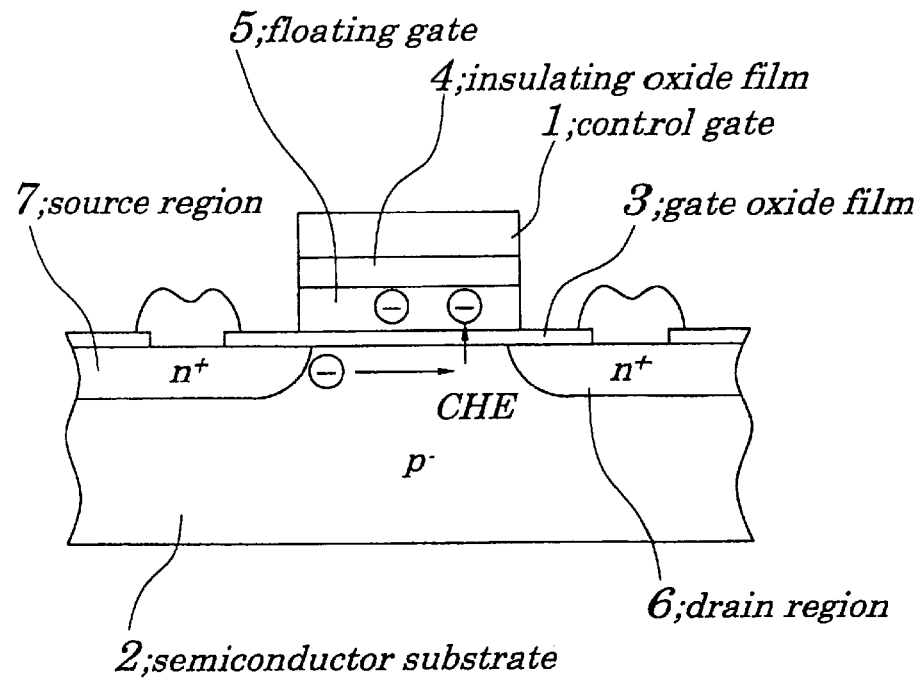
FIGS. 22A and 22B are cross-sectional views illustrating conventional methods for writing and erasing data in a one-device type memory cell.
Figure 22B:
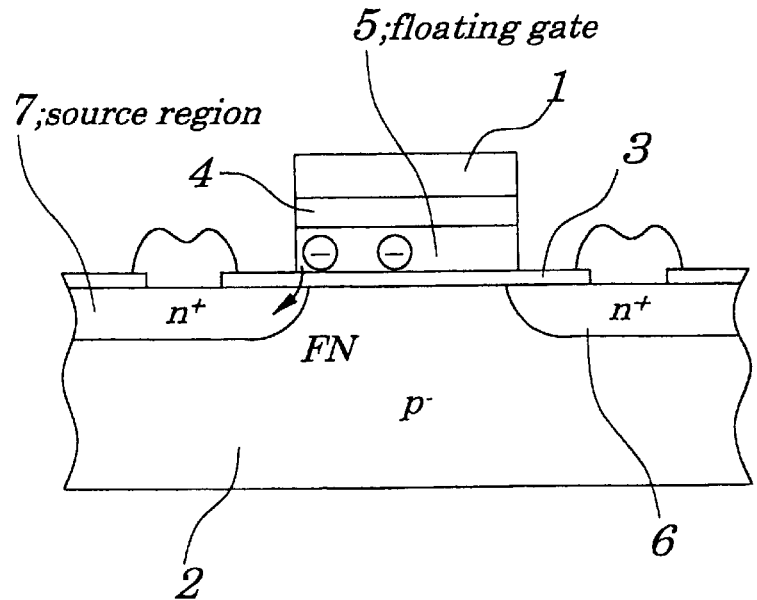
Figure 23A:
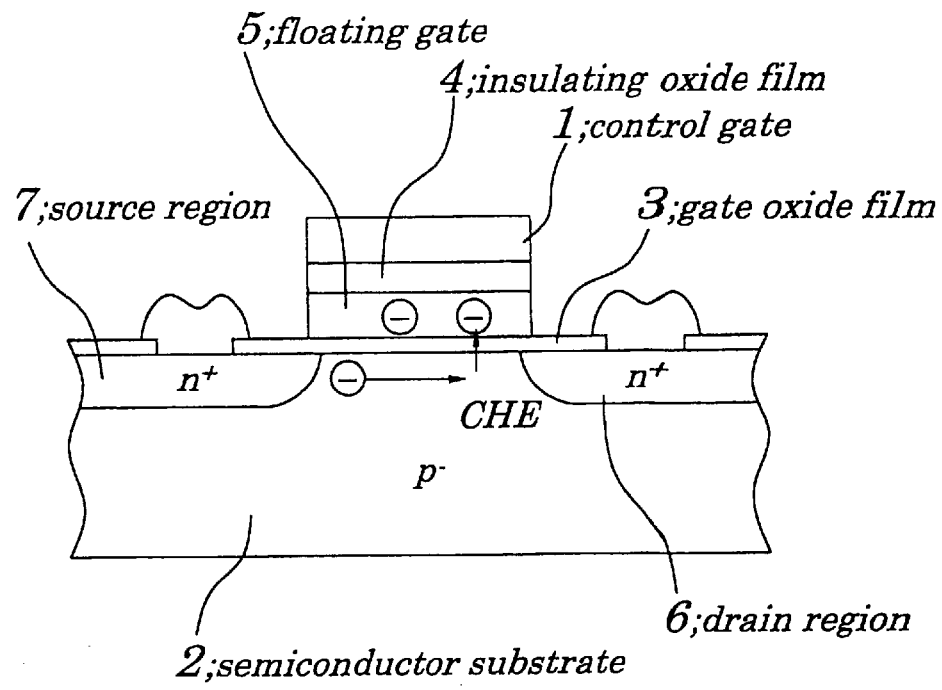
FIGS. 23A and 23B are cross-sectional views illustrating another conventional method for writing and erasing data in a one-device type memory cell.
Figure 23B:
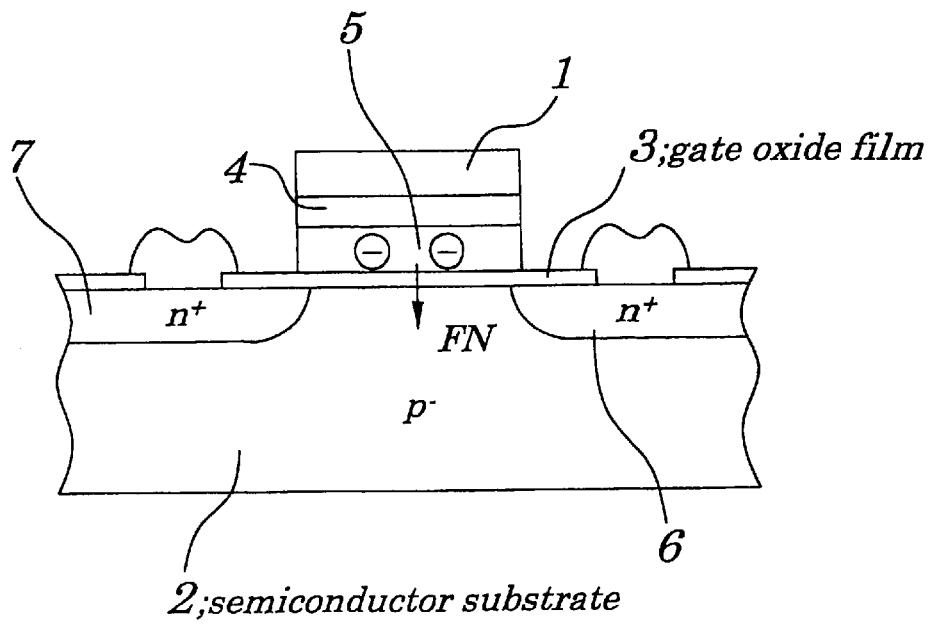
Figure 24A:
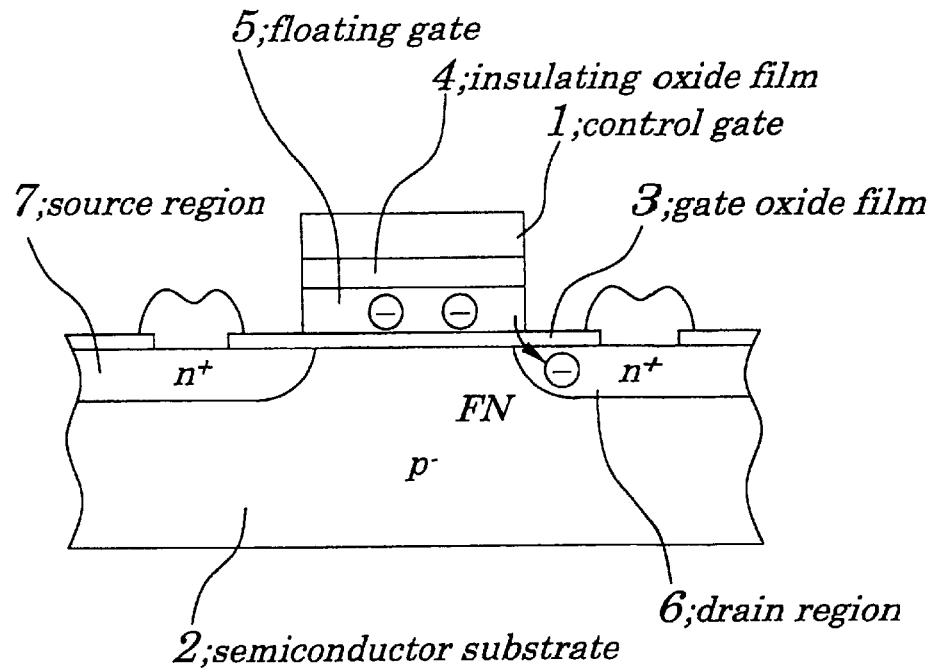
FIGS. 24A and 24B are cross-sectional views illustrating further conventional methods for writing and erasing data in a one-device memory cell.
Figure 24B:
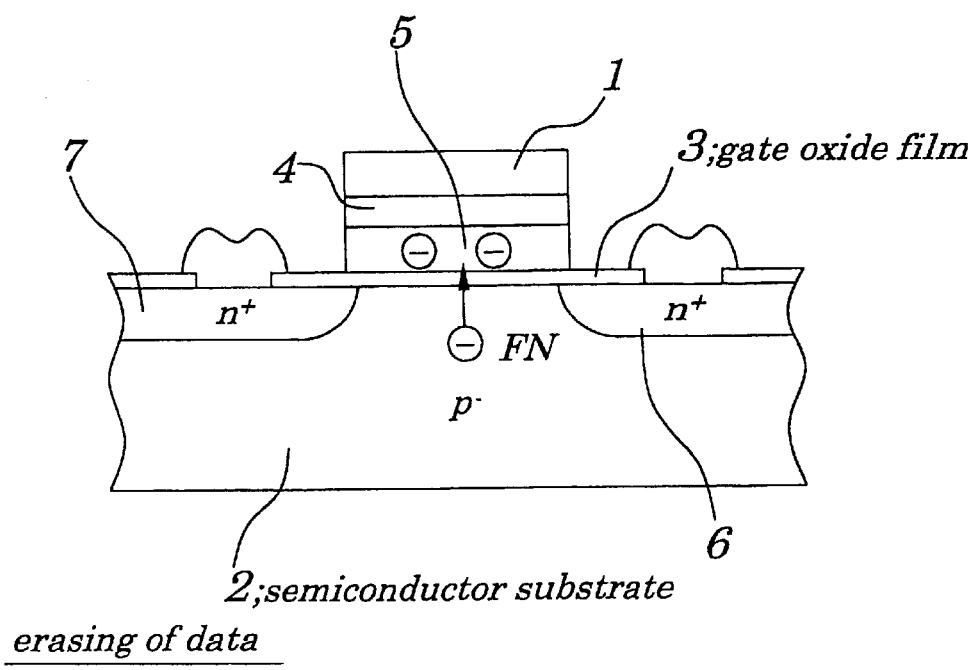
Figure 25A:
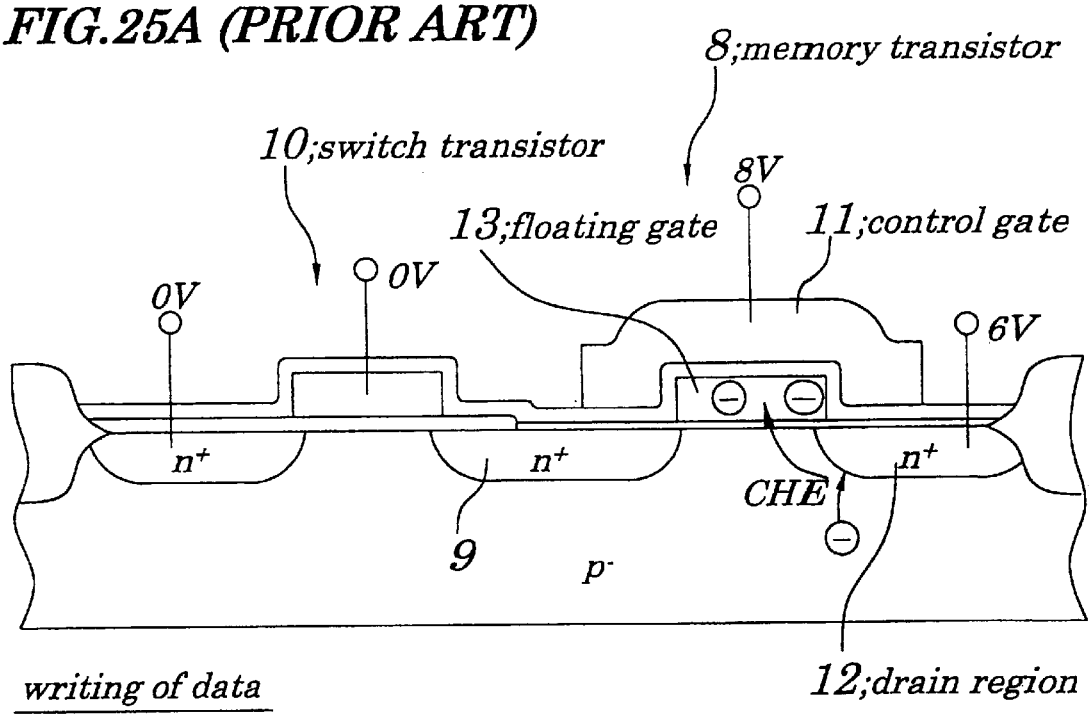
FIGS. 25A and 25B is a cross-sectional view showing conventional methods for writing and erasing data in a two-device type memory cell.
Figure 25B:
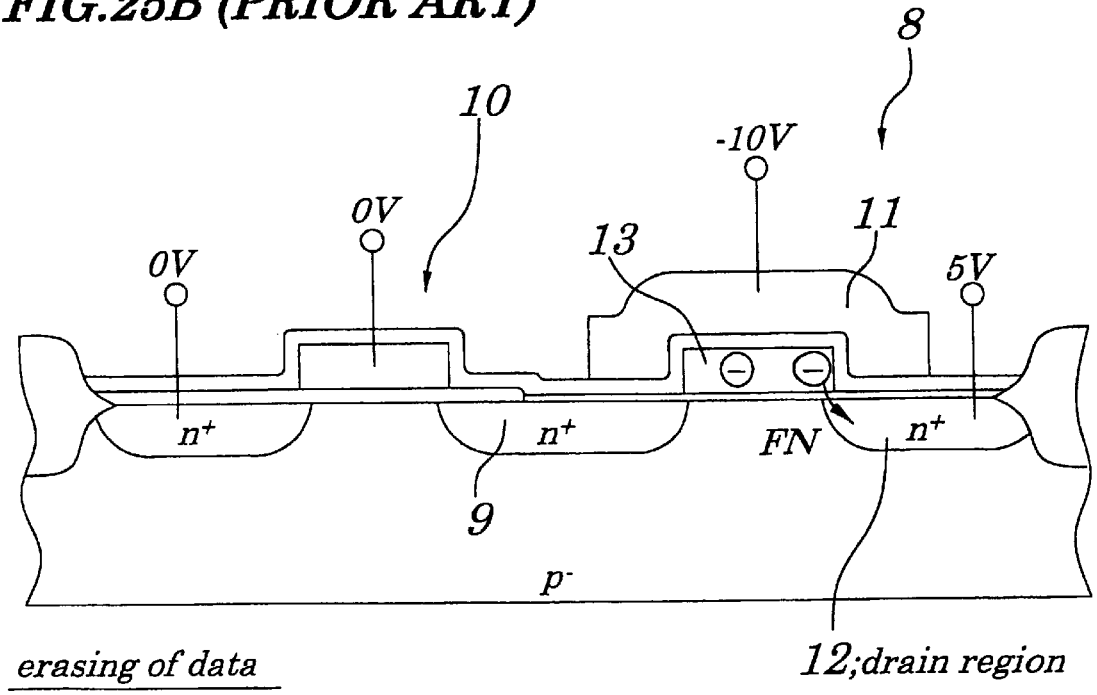
Figure 26:
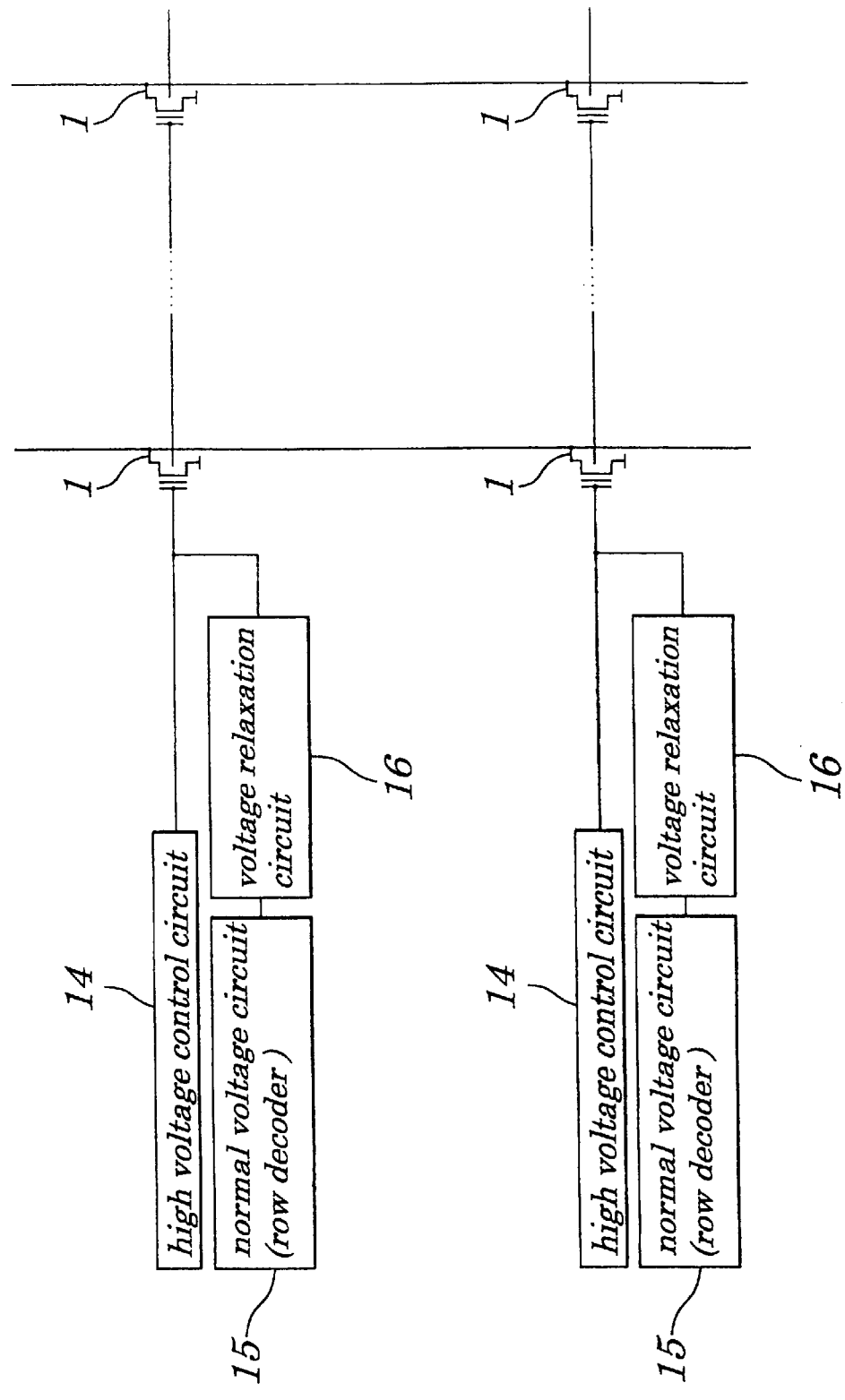
FIG. 26 shows a wiring connection diagram of high voltage control circuits and normal voltage circuits used as a gate power supply circuit in a conventional one-device type memory cell.
Figure 27:
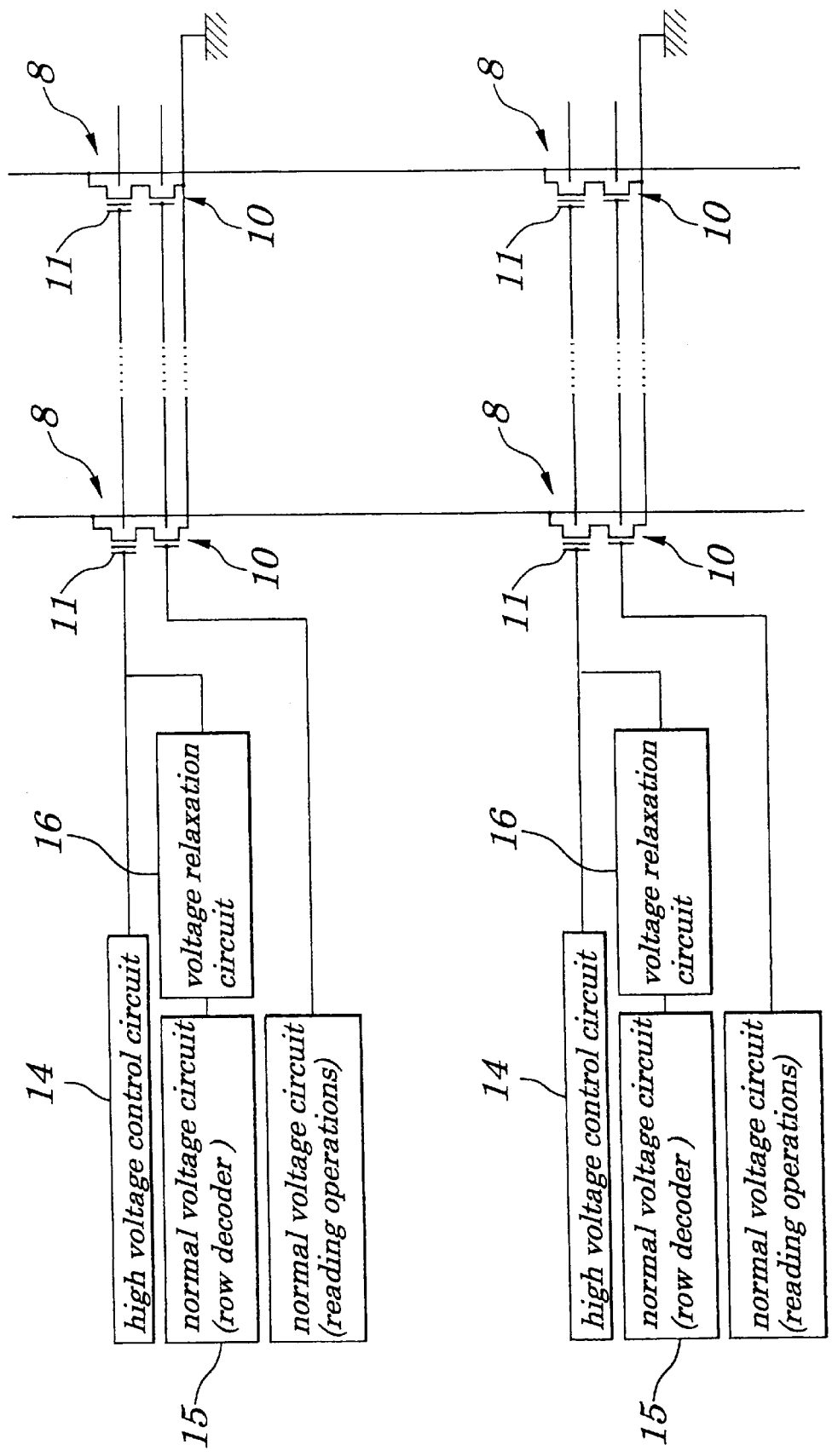
FIG. 27 shows a wiring connection diagram of high voltage control circuits and normal voltage circuits used as gate power supply circuits in a conventional two-device type memory cell.
Figure 28:
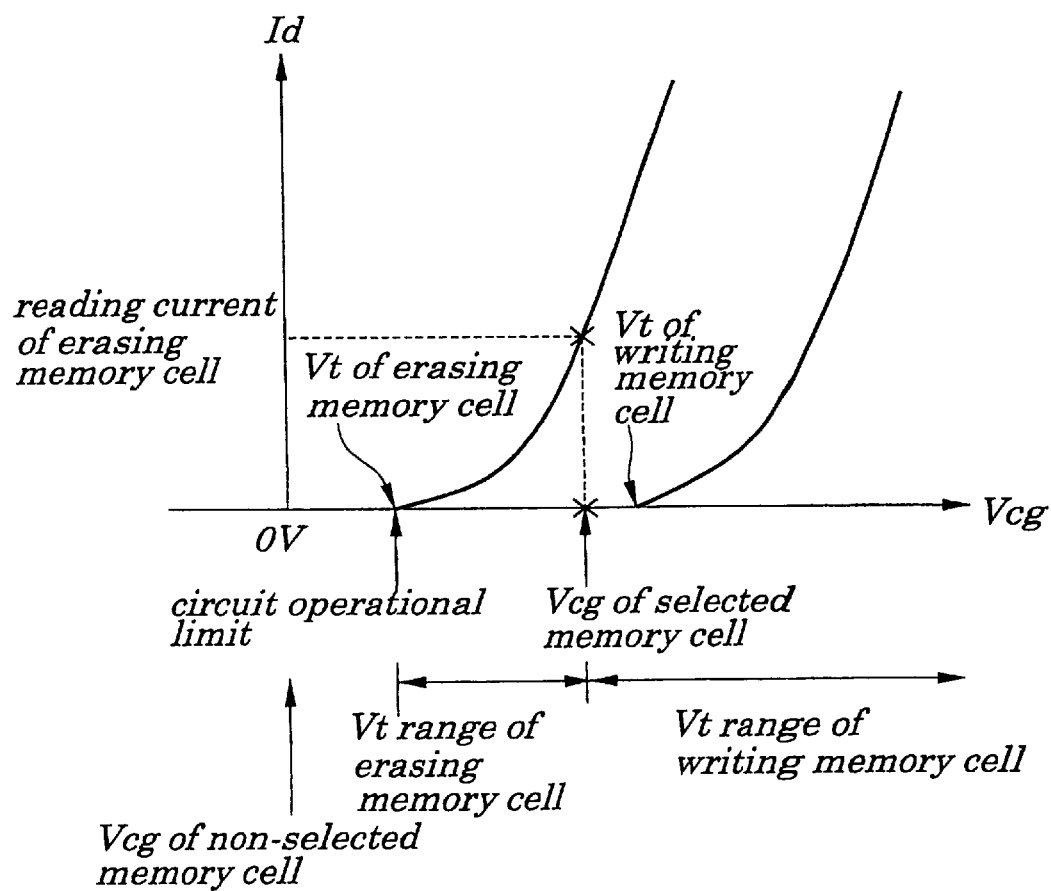
FIG. 28 is a diagram of a control gate voltage—drain current used to describe problems in conventional technologies.

Furthermore, when two-device or three-device type EEPROMs are manufactured according to the embodiments described above, as in the case of the floating gate 28 and the control gate 27 of the memory transistors, as shown in FIGS. 21A and 21B, if the switching gate 30 constituting the switching transistor ST and the selecting gate 35 constituting the selection transistor DT may be of a dual-type and the upper and lower gates are short-circuited at an appropriate location, then three types of transistors can be manufactured in approximately the same processes, which thus allows the reduction of man-hours and production time.

Also, if each memory transistor is formed in a well, in the operations of writing and erasing data, by applying a high voltage between the control gate of the memory transistor and the well in a selected memory cell, carriers may be injected by tunnel currents from the semiconductor region disposed immediately below the floating gate to the floating gate or carriers may be attracted by tunnel currents from the bottom face of the floating gate to the semiconductor region immediately below the bottom face thereof. This can apply to three-device type transistors.

As described above, according to two-device type non-volatile semiconductor memory devices of the present invention, the selection or non-selection of the memory cells at the time of read data is performed not by the control gate of the memory transistor but by the control on the voltage of the switch transistor, thus enabling reading of data at much higher speed.

Additionally, to the first word line linked with to the control gate is connected to only the high voltage control circuit and is not connected to the normal voltage circuit, while, to the second word line linked with the switching gate is connected to only normal voltage circuit and is not connected to the high voltage control circuit, thus eliminating the need of the voltage relaxation circuit of the same numbers as word lines and resulting in the advantageous reduction of the numbers of devices used and reduced area of the device.

Also, at the time of read data, regardless of selection or non-selection, the voltage of the control gate is set to 0 V, which can prevent excessive voltage stress on the floating gate, thus improving the data holding characteristics thereof. Moreover, since the threshold voltage Vt of the erasing memory cell in the range for lower voltages has no limit on the operation of a circuit, the reading contrast can be improved.

In addition, partially local attraction of electrons from the floating gate can be avoided at the time of erasing operations and owing to the uniform attraction of electrons on the whole bottom face, local damage to the gate oxide film can be prevented, thus making a long life device. The attraction of electrons by FN tunnel currents on the whole bottom face of the floating gate allows the reduction in power consumption and high speed erasing operations.

Moreover, owing to a depletion-type erasing operation, no problems of over-erasing or over-writing exist. Accordingly, the threshold voltage Vt of the erasing memory cell in the range for lower voltages has no limit on the operation of a circuit. This eliminates the need for controlling to narrow the threshold voltage Vt of the erasing memory cell, thus providing ease of operation of the device.

Furthermore, partially local attraction of electrons from the floating gate can be avoided at the time of writing operations and owing to the uniform attraction of electrons on the whole bottom face, local damage to the gate oxide film can be prevented, thus making a long life device. The injection of electrons by FN tunnel currents on the whole bottom face of the floating gate allows effective injection of electrons and the reduction in power consumption and high speed writing operations.

According to three-device type non-volatile semiconductor memory devices of the present invention, the selection or non-selection of the memory cells at the time of read data is performed not by the control gate of the memory transistor but by the control on the voltage of the switch transistor, thus enabling reading of data at much higher speed.

Thus, in the writing operations as well as the erasing operations, the same effects as those in the two-device type non-volatile semiconductor memory device can be achieved.

Additionally, according to the present invention, in the reading, erasing and writing operations, the erasing by block (by byte) is made possible.

Moreover, the introduction of the selecting transistor or the byte selecting lines and the like can prevent the bad influence of, so-called, drain disturbance that reading, erasing and writing operations of selected blocks are affected by non-selected blocks.

Finally, the present application claims the priority based on Japanese Patent Application No. Hei10-294676 filed on Sep. 30, 1998, which is herein incorporated by reference.

What is claimed is:

1. A non-volatile semiconductor memory device being able to electrically rewrite data, comprising:

two or more pairs of word lines;

two or more bit lines; and more than one non-volatile memory cell disposed at the point of intersection of said pairs of word lines and said bit lines;

whereby said each non-volatile memory cell composed of at least two MIS-type devices containing a stacked gate-type memory transistor having a control gate and a floating gate for accumulation of carriers and a switch transistor having a switching gate;

said each pair of word lines being composed of a pair of a first word line and a second word line;

said each first word line being connected to said control gate of a group of memory cells disposed along said first word line or along a first branched word line branched from said first word line and said each second word line being connected to said switching gate of a group of memory cells disposed along said second word line or along a second branched word line branched from said second word line;

said each bit line being connected to a drain of a group of said memory cells disposed along said bit line;

said switching gate of said switch transistor being used to control selection or non-selection of selected memory cells on selecting bit lines at the time of read data; and said selecting bit lines being used to read data from selected memory cells.

2. The non-volatile semiconductor memory device according to claim 1, wherein data is read at the time of read data regardless of whether any memory cell is selected or not selected with said control gates of all memory transistors maintained at the same potential via said first word lines by controlling normal voltage with said switching gate of said switch transistor.

3. The non-volatile semiconductor memory device according to claim 1, wherein data is read at the time of read data regardless of whether any memory cell is selected or not selected with the voltage of said control gates of all memory transistors maintained at 0 V or around it via said first word lines by controlling the normal voltage with said switching gate of said switch transistor.

4. The non-volatile semiconductor memory device according to claim 1, wherein data is written at the time of writing data by connecting a high voltage control circuit to said control gate of said memory transistor through said first word line, while data is read at the time of read data by connecting said normal voltage circuit to said switching gate of said switch transistor through said second word line.

5. The non-volatile semiconductor memory device according to claim 1, wherein said switch transistor is connected serially to a source of said memory transistor.

6. The non-volatile semiconductor memory device according to claim 5, wherein data is erased by attracting carriers from said floating gate of said memory transistor and carriers are attracted from said floating gate of said memory transistor sufficiently enough to cause the erasing state to be of a depletion type.

7. The non-volatile semiconductor memory device according to claim 1, wherein said non-volatile semiconductor memory device is a flash memory.

8. The non-volatile semiconductor memory device according to claim 1, wherein said memory cell is composed of a MIOS-type memory transistor instead of said stacked-gate type memory transistor, the gate insulating film of which consists of a first insulating film on a lower layer and a second insulating film on an upper layer in which carriers are accumulated in the trap surface in said second insulating film existing in the vicinity of an interface between the first insulating film and the second insulating film.

9. A non-volatile semiconductor memory device being able to electrically rewrite data, comprising:

two or more pairs of word lines and two or more bit lines formed on a semiconductor substrate; and more than one non-volatile memory cell disposed at the point of intersection of said pairs of word lines and said bit lines;

whereby said each non-volatile memory cell composed of at least two MIS-type devices containing a stacked gate-type memory transistor having a control gate and a floating gate for accumulation of carriers and a switch transistor having a switching gate;

said each pair of word lines being composed of a pair of a first word line and a second word line;

said each first word line being connected to said control gate of a group of memory cells disposed along said first word line or along a first branched word line branched from said first word line and said each second word line being connected to said switching gate of a group of memory cells disposed along said second word line or along a second branched word line branched from said second word line;

said each bit line being connected to a drain of a group of said memory cells disposed along said bit line; and said selected memory cell wherein at the time of writing and erasing data a high voltage is applied between said control gate of said memory transistor and said semiconductor substrate and carriers are injected by tunnel currents from a semiconductor region disposed immediately below said floating gate to said floating gate or carriers are attracted by tunnel currents from the bottom face of said floating gate to said semiconductor region disposed immediately below said floating gate.

10. The non-volatile semiconductor memory device according to claim 9, wherein when said each memory transistor is formed within a well at the time of writing and erasing data in said selected memory cell, a high voltage is applied between said control gate of said memory transistor and said well and carriers are injected by tunnel currents from a semiconductor region disposed immediately below said floating gate to said floating gate or carriers are attracted by tunnel currents from the bottom face of said floating gate to said semiconductor region disposed immediately below said floating gate.

11. The non-volatile semiconductor memory device according to claim 9, wherein at the time of erasing data, a source and a drain of said memory transistor is set to approximately the same potential as that of a semiconductor region disposed immediately below said floating gate or to a floating state.

12. The non-volatile semiconductor memory device according to claim 9, wherein said memory transistor is composed of an n-channel transistor and to said control gate of said memory transistor selected through said first word line is applied a voltage being higher than a substrate potential and wherein to said bit line selected to write a "0" (or a "1") is applied a voltage being at the same level as for said substrate, while to said bit line selected to write a "1" (or a "0") and to a control gate of non-selected memory transistors is applied a voltage being higher than said substrate potential and lower than that of said control gate of said selected memory transistor so that data is written.

13. The non-volatile semiconductor memory device according to claim 12, wherein at the time of writing data, the control gate potential of said non-selected memory transistor is higher than that of said bit line selected to write a "1" (or a "0").

14. The non-volatile semiconductor memory device according to claim 12, wherein at the time of writing data, said switch transistor is turned off, and a source and a drain of said memory transistor in selected memory cells are set to approximately the same potential as that of a semiconductor region disposed immediately below said floating gate.

15. The non-volatile semiconductor memory device according to claim 9, wherein said switch transistor is connected to a source of said memory transistor.

16. The non-volatile semiconductor memory device according to claim 9, wherein at the time of writing data, data is written by connecting a high voltage control circuit to said control gate of said memory transistor through said first word line, while data is read by connecting a normal voltage circuit to said switching gate of said switch transistor through said second word line.

17. The non-volatile semiconductor memory device according to claim 9, wherein said switch transistor is connected serially to a source of said memory transistor.

18. The non-volatile semiconductor memory device according to claim 17, wherein carriers are attracted from said floating gate of said memory transistor to erase data and, at the time of erasing data, carriers are attracted from said floating gate of said memory transistor sufficiently enough to cause the erasing state to be of a depletion type.

19. The non-volatile semiconductor memory device according to claim 9, wherein said non-volatile semiconductor memory device is a flash memory.

20. The non-volatile semiconductor memory device according to claim 9, wherein said memory cell is composed of a MIOS-type memory transistor instead of said stacked-gate type memory transistor, the gate insulating film of which consists of a first insulating film on a lower layer and a second insulating film on an upper layer in which carriers are accumulated in the trap surface in said second insulating film existing in the vicinity of an interface of these films.

21. A non-volatile semiconductor memory device being able to electrically rewrite data, comprising:

two or more groups of word lines;

two or more bit lines; and more than one non-volatile memory cell disposed at the point of intersection of said groups of word lines and bit lines;

whereby said each memory cell composed of three MIS-type devices containing a stacked gate-type memory transistor having a control gate and a floating gate for accumulation of carriers, a switch transistor having a switching gate connected serially to a source of said memory transistor and a selection transistor having a selecting gate connected serially to a drain of said memory transistor;

said each group of word lines being composed of a group of a first word line, a second word line and a third word line;

said each first word line being connected to said control gate of a group of memory cells disposed along said first word line or along a first branched word line branched from said first word line, said each second word line being connected to said switching gate of a group of memory cells disposed along said second word line or along a second branched word line branched from said second word line and said each third word line being connected to said selecting gate of a group of memory cells disposed along said third word line or along a third branched word line branched from said third word line;

said each bit line being connected to a drain of a group of said memory cells disposed along said bit line; and said switching gate of said switch transistor and said selecting gate of said selection transistor being used, at the time of read data, to control selection or non-selection of selected memory cells on selecting bit lines to read data from said selected memory through said selecting bit line.

22. The non-volatile semiconductor memory device according to claim 21, wherein data is read at the time of read data, regardless of whether any memory cell is selected or not selected, with said control gates of all memory transistors maintained at the same potential through said first word lines, by controlling normal voltage with said switching gate of said switch transistor and said selecting gate of said selection transistor.

23. The non-volatile semiconductor memory device according to claim 21, wherein data is read at the time of read data, regardless of whether any memory cell is selected or not selected, with the voltage of said control gates of all memory transistors maintained at 0 V or around it via said first word lines by controlling the normal voltage with said switching gate of said switch transistor and said selecting gate of said selection transistor.

24. The non-volatile semiconductor memory device according to claim 21, wherein data is erased by attracting carriers from said floating gate of said memory transistor and carriers are attracted from said floating gate of said memory transistor sufficiently enough to cause the erasing state to be of a depletion type.

25. The non-volatile semiconductor memory device according to claim 21, wherein said memory cell is composed of a MIOS-type memory transistor instead of said stacked-gate type memory transistor, the gate insulating film of which consists of a first insulating film on a lower layer and a second insulating film on an upper layer in which carriers are accumulated in the trap surface in said second insulating film existing in the vicinity of an interface of these films.

26. The non-volatile semiconductor memory device according to claim 21, wherein in said non-volatile semiconductor memory device, said two or more memory cells are divided into n-pieces (n being a natural number of 2 or more) of blocks and data is able to be rewritten by block.

27. A non-volatile semiconductor memory device being able to electrically rewrite data, comprising:

two or more groups of word lines and two or more bit lines formed on a semiconductor substrate; and more than one non-volatile memory cell disposed at the point of intersection of said groups of word lines and said bit lines;

whereby said each non-volatile memory cell composed of three MIS-type devices containing a stacked gate-type memory transistor having a control gate and a floating gate for accumulation of carriers, a switch transistor having a switching gate connected serially to a source of said memory transistor and a selection transistor having a selecting gate connected serially to a drain of said memory transistor;

said each group of word lines being composed of a group of a first word line, a second word line and a third word line;

said each first word line being connected to said control gate of a group of memory cells disposed along said first word line or along a first branched word line branched from said first word line, said each second word line being connected to said switching gate of a group of memory cells disposed along said second word line or along a second branched word line branched from said second word line and said each third word line being connected to said selecting gate of a group of memory cells disposed along said third word line or along a third branched word line branched from said third word line;

said each bit line being connected to a drain of a group of said memory cells disposed along said bit line; and said selected memory cell wherein at the time of writing and erasing data, a high voltage is applied between said control gate of said memory transistor and said semiconductor substrate and carriers are injected by tunnel currents from a semiconductor region disposed immediately below said floating gate to said floating gate or carriers are attracted by tunnel currents from the bottom face of said floating gate to said semiconductor region disposed immediately below said floating gate.

28. The non-volatile semiconductor memory device according to claim 27, wherein when said each memory transistor is formed within a well at the time of writing and erasing data in said selected memory cell, a high voltage is applied between said control gate of said memory transistor and said well and carriers are injected by tunnel currents from a semiconductor region disposed immediately below said floating gate to said floating gate, or carriers are attracted by tunnel currents from the bottom face of said floating gate to said semiconductor region immediately below said floating gate.

29. The non-volatile semiconductor memory device according to claim 27, wherein at the time of erasing data, a source and a drain of said memory transistor are set to approximately the same potential as that of a semiconductor region disposed immediately below said floating gate or to a floating state.

30. The non-volatile semiconductor memory device according to claim 27, wherein, at the time of writing data, in selected memory cells, said selected transistor is turned ON and, at the same time, said switch transistor is turned OFF, while, in unselected memory cells, both said selected transistor and said switch transistor are turned OFF.

31. The non-volatile semiconductor memory device according to claim 30, wherein said memory transistor is composed of an n-channel transistor and to said control gate of said memory transistor selected through said first word line is applied a voltage being higher than a substrate potential and wherein to said bit line selected to write a "0" (or a "1") is applied a voltage being at approximately the same level as for said substrate, while to said bit line selected to write a "1" (or a "0") is applied a voltage being higher than said substrate potential and lower than that of said control gate of said selected memory transistor so that data is written.

32. The non-volatile semiconductor memory device according to claim 27, wherein carriers are attracted from said floating gate of said memory transistor to erase data and at the time of erasing data carriers are attracted from said floating gate of said memory transistor sufficiently enough to cause the erasing state to be of a depletion type.

33. The non-volatile semiconductor memory device according to claim 27, wherein said memory cell is composed of a MIOS-type memory transistor instead of said stacked-gate type memory transistor, the gate insulating film of which consists of a first insulating film on a lower layer and a second insulating film on an upper layer in which carriers are accumulated in the trap surface in said second insulating film existing in the vicinity of an interface of these films.

* * * * *